United States Patent
Bibl et al.

(10) Patent No.: US 9,370,864 B2
(45) Date of Patent: Jun. 21, 2016

(54) COMPLIANT MICRO DEVICE TRANSFER HEAD

(71) Applicant: LuxVue Technology Corporation, Santa Clara, CA (US)

(72) Inventors: Andreas Bibl, Los Altos, CA (US); John A. Higginson, Santa Clara, CA (US); Hsin-Hua Hu, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/723,231

(22) Filed: May 27, 2015

(65) Prior Publication Data

US 2015/0273700 A1 Oct. 1, 2015

Related U.S. Application Data

(63) Continuation of application No. 13/466,966, filed on May 8, 2012, now Pat. No. 9,105,492.

(51) Int. Cl.
*G01P 15/125* (2006.01)
*B25J 15/00* (2006.01)
(Continued)

(52) U.S. Cl.
CPC .......... *B25J 15/0052* (2013.01); *B25J 15/0085* (2013.01); *B81C 99/002* (2013.01); *H01L 21/6835* (2013.01); *H01L 24/75* (2013.01); *H01L 24/97* (2013.01); *H01L 25/0753* (2013.01); *B81B 2201/038* (2013.01); *H01L 21/67144* (2013.01); *H01L 24/83* (2013.01); *H01L 33/0079* (2013.01); *H01L 2221/68322* (2013.01); *H01L 2221/68354* (2013.01); *H01L 2221/68363* (2013.01); *H01L 2221/68381* (2013.01); *H01L 2224/2919* (2013.01); *H01L 2224/29036* (2013.01);

(Continued)

(58) Field of Classification Search
CPC ............... B25J 15/0052; G01P 15/125; G01P 15/0802; A63B 2220/40; B41J 2/39; B41J 2/385
USPC .................... 73/514.32, 514.16, 514.01, 488; 347/159, 111
See application file for complete search history.

(56) References Cited

U.S. PATENT DOCUMENTS 4,837,176 A    6/1989   Zdebel et al.
5,067,002 A   11/1991   Zdebel et al.
(Continued)

FOREIGN PATENT DOCUMENTS

JP    07-060675 A    3/1995
JP    11-142878      5/1999
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Lisa Caputo
*Assistant Examiner* — Nigel Plumb
(74) *Attorney, Agent, or Firm* — Blakely, Sokoloff, Taylor & Zafman LLP

(57) ABSTRACT

A compliant micro device transfer head and head array are disclosed. In an embodiment a micro device transfer head includes a spring portion that is deflectable into a space between a base substrate and the spring portion.

17 Claims, 32 Drawing Sheets

(51) Int. Cl.
  *H01L 25/075* (2006.01)
  *H01L 21/683* (2006.01)
  *B81C 99/00* (2010.01)
  *H01L 21/67* (2006.01)
  *H01L 33/00* (2010.01)
  *H01L 23/00* (2006.01)

(52) U.S. Cl.
  CPC .............. *H01L 2224/29101* (2013.01); *H01L 2224/7565* (2013.01); *H01L 2224/7598* (2013.01); *H01L 2224/83815* (2013.01); *H01L 2224/83855* (2013.01); *H01L 2224/97* (2013.01); *H01L 2924/12041* (2013.01)

(56) References Cited

U.S. PATENT DOCUMENTS

| | | | |
|---|---|---|---|
| 5,110,752 A | 5/1992 | Lu | |
| 5,266,514 A | 11/1993 | Tuan et al. | |
| 5,426,558 A | 6/1995 | Sherman | |
| 5,493,470 A | 2/1996 | Zavracky et al. | |
| 5,592,358 A | 1/1997 | Shamouilian et al. | |
| 5,640,133 A | 6/1997 | MacDonald et al. | |
| 5,745,331 A | 4/1998 | Shamouilian et al. | |
| 5,771,253 A | 6/1998 | Chang-Hasnain et al. | |
| 5,839,187 A | 11/1998 | Sato et al. | |
| 5,851,664 A | 12/1998 | Bennett et al. | |
| 5,888,847 A | 3/1999 | Rosoker et al. | |
| 5,903,428 A | 5/1999 | Grimard et al. | |
| 5,996,218 A | 12/1999 | Shamouilian et al. | |
| 6,036,302 A * | 3/2000 | Hotomi | B41J 2/06 347/55 |
| 6,071,795 A | 6/2000 | Cheung et al. | |
| 6,096,368 A | 8/2000 | Sun | |
| 6,335,263 B1 | 1/2002 | Cheung et al. | |
| 6,379,929 B1 | 4/2002 | Burns et al. | |
| 6,403,985 B1 | 6/2002 | Fan et al. | |
| 6,420,242 B1 | 7/2002 | Cheung et al. | |
| 6,521,511 B1 | 2/2003 | Inoue et al. | |
| 6,552,328 B1 * | 4/2003 | Berlin | H01S 5/183 250/221 |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,786,390 B2 | 9/2004 | Yang et al. | |
| 6,813,291 B2 | 11/2004 | Wang et al. | |
| 6,825,105 B2 | 11/2004 | Grover et al. | |
| 6,878,607 B2 | 4/2005 | Inoue et al. | |
| 7,033,842 B2 | 4/2006 | Haji et al. | |
| 7,148,127 B2 | 12/2006 | Oohata et al. | |
| 7,208,337 B2 | 4/2007 | Eisert et al. | |
| 7,307,719 B2 * | 12/2007 | Wang | G01J 3/26 356/301 |
| 7,335,527 B2 | 2/2008 | Sawyer et al. | |
| 7,353,596 B2 | 4/2008 | Shida et al. | |
| 7,358,158 B2 | 4/2008 | Aihara et al. | |
| 7,585,703 B2 | 9/2009 | Matsumura et al. | |
| 7,622,367 B1 | 11/2009 | Nuzzo et al. | |
| 7,723,764 B2 | 5/2010 | Oohata et al. | |
| 7,785,481 B2 | 8/2010 | Wang | |
| 7,795,629 B2 * | 9/2010 | Watanabe | H01L 21/6835 257/89 |
| 7,797,820 B2 | 9/2010 | Shida et al. | |
| 7,829,366 B2 | 11/2010 | Miller et al. | |
| 7,838,410 B2 | 11/2010 | Hirao et al. | |
| 7,854,365 B2 | 12/2010 | Li et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,929,195 B2 | 4/2011 | Bifano | |
| 7,943,497 B2 | 5/2011 | Nakai | |
| 7,972,875 B2 | 7/2011 | Rogers et al. | |
| 7,982,296 B2 | 7/2011 | Nuzzo et al. | |
| 7,989,266 B2 | 8/2011 | Borthakur et al. | |
| 7,999,454 B2 | 8/2011 | Winters et al. | |
| 8,023,248 B2 * | 9/2011 | Yonekura | H01L 21/6833 361/234 |
| 8,333,860 B1 | 12/2012 | Bibl et al. | |
| 8,349,116 B1 | 1/2013 | Bibl et al. | |
| 8,383,506 B1 | 2/2013 | Golda et al. | |
| 8,415,767 B1 | 4/2013 | Golda et al. | |
| 8,415,768 B1 | 4/2013 | Golda et al. | |
| 8,440,546 B2 | 5/2013 | Nuzzo et al. | |
| 8,506,867 B2 | 8/2013 | Menard | |
| 8,569,115 B1 | 10/2013 | Golda et al. | |
| 8,664,699 B2 | 3/2014 | Nuzzo et al. | |
| 8,686,542 B2 * | 4/2014 | Golda | H01L 23/5384 257/619 |
| 8,791,530 B2 | 7/2014 | Bibl et al. | |
| 8,865,489 B2 | 10/2014 | Rogers et al. | |
| 8,877,648 B2 | 11/2014 | Bower et al. | |
| 8,889,485 B2 | 11/2014 | Bower | |
| 8,934,259 B2 | 1/2015 | Bower et al. | |
| 2001/0029088 A1 | 10/2001 | Odajima et al. | |
| 2002/0022308 A1 | 2/2002 | Ahn et al. | |
| 2002/0061042 A1 | 5/2002 | Wang et al. | |
| 2002/0076848 A1 | 6/2002 | Spooner et al. | |
| 2002/0168671 A1 | 11/2002 | Burns et al. | |
| 2002/0171518 A1 | 11/2002 | Hsu et al. | |
| 2002/0172969 A1 | 11/2002 | Burns et al. | |
| 2003/0010975 A1 | 1/2003 | Gibb et al. | |
| 2003/0022474 A1 | 1/2003 | Grover et al. | |
| 2003/0169786 A1 | 9/2003 | Kapon et al. | |
| 2003/0177633 A1 | 9/2003 | Haji et al. | |
| 2004/0056307 A1 | 3/2004 | Cho et al. | |
| 2004/0124490 A1 | 7/2004 | Bohr et al. | |
| 2004/0161943 A1 | 8/2004 | Ren et al. | |
| 2004/0232439 A1 | 11/2004 | Gibb et al. | |
| 2005/0210988 A1 | 9/2005 | Amano et al. | |
| 2005/0214963 A1 * | 9/2005 | Daniels | H01L 24/29 438/29 |
| 2005/0232728 A1 | 10/2005 | Rice et al. | |
| 2006/0016555 A1 * | 1/2006 | Yamauchi | H01L 24/75 156/285 |
| 2006/0065905 A1 | 3/2006 | Eisert et al. | |
| 2006/0157721 A1 | 7/2006 | Tran et al. | |
| 2006/0160276 A1 | 7/2006 | Brown et al. | |
| 2006/0214299 A1 | 9/2006 | Fairchild et al. | |
| 2007/0048902 A1 | 3/2007 | Hiatt et al. | |
| 2007/0166851 A1 | 7/2007 | Tran et al. | |
| 2007/0194330 A1 | 8/2007 | Ibbetson et al. | |
| 2008/0023841 A1 * | 1/2008 | Nakasato | H01L 21/4846 257/773 |
| 2008/0048520 A1 | 2/2008 | Gulvin et al. | |
| 2008/0163481 A1 | 7/2008 | Shida et al. | |
| 2008/0194054 A1 | 8/2008 | Lin et al. | |
| 2008/0196237 A1 | 8/2008 | Shinya et al. | |
| 2008/0280069 A1 * | 11/2008 | Parce | B82B 3/00 427/580 |
| 2008/0283190 A1 | 11/2008 | Papworth et al. | |
| 2008/0303038 A1 | 12/2008 | Grotsch et al. | |
| 2009/0068774 A1 | 3/2009 | Slater et al. | |
| 2009/0090693 A1 | 4/2009 | Wang | |
| 2009/0146303 A1 | 6/2009 | Kwon | |
| 2009/0218642 A1 | 9/2009 | Miller et al. | |
| 2009/0301176 A1 | 12/2009 | Rowe et al. | |
| 2009/0303713 A1 | 12/2009 | Chang et al. | |
| 2009/0314991 A1 | 12/2009 | Cho et al. | |
| 2010/0039747 A1 | 2/2010 | Sansoni et al. | |
| 2010/0046134 A1 | 2/2010 | Mizuno et al. | |
| 2010/0105172 A1 | 4/2010 | Li et al. | |
| 2010/0142114 A1 | 6/2010 | Purohit et al. | |
| 2010/0149720 A1 | 6/2010 | Fujisawa et al. | |
| 2010/0188794 A1 | 7/2010 | Park et al. | |
| 2010/0203659 A1 | 8/2010 | Akaike et al. | |
| 2010/0203661 A1 | 8/2010 | Hodota | |
| 2010/0248484 A1 | 9/2010 | Bower et al. | |
| 2010/0276726 A1 | 11/2010 | Cho et al. | |
| 2011/0003410 A1 | 1/2011 | Tsay et al. | |

(56) References Cited

U.S. PATENT DOCUMENTS

| | | | |
|---|---|---|---|
| 2011/0049540 A1 | 3/2011 | Wang et al. | |
| 2011/0121462 A1 | 5/2011 | Kim | |
| 2011/0151602 A1 | 6/2011 | Speier | |
| 2011/0159615 A1 | 6/2011 | Lai | |
| 2011/0210357 A1 | 9/2011 | Kaiser et al. | |
| 2012/0027557 A1 | 2/2012 | Ashdown et al. | |
| 2012/0064642 A1 | 3/2012 | Huang et al. | |
| 2012/0134065 A1 | 5/2012 | Furuya et al. | |
| 2013/0126891 A1 | 5/2013 | Bibl et al. | |
| 2013/0285086 A1 | 10/2013 | Hu et al. | |
| 2013/0300812 A1 | 11/2013 | Bibl et al. | |
| 2013/0316529 A1 | 11/2013 | Golda et al. | |
| 2014/0064904 A1* | 3/2014 | Bibl | B81C 1/0015 414/751.1 |
| 2014/0373898 A1 | 12/2014 | Rogers et al. | |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-079745 A | 3/2004 |
| JP | 2004-095944 A | 3/2004 |
| JP | 2006-0148602 | 6/2006 |
| JP | 2008-200821 A | 9/2008 |
| JP | 2010-056458 A | 3/2010 |
| JP | 2010-186829 A | 8/2010 |
| KR | 10-2002-0022557 A | 3/2002 |
| KR | 10-2004-0030610 A | 4/2004 |
| KR | 10-0610632 B1 | 8/2006 |
| KR | 10-2007-0042214 A | 4/2007 |
| KR | 10-2007-0093091 A | 9/2007 |
| KR | 10-0800825 B1 | 1/2008 |
| KR | 10-0973928 B1 | 8/2010 |
| KR | 10-1001454 B1 | 12/2010 |
| KR | 10-2007-0006885 A | 1/2011 |
| KR | 10-2011-0075451 A | 7/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low_Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

PCT International Preliminary Report on Patentability for International Application No. PCT/US2013/039128, mailed Nov. 20, 2014, 6 pages.

PCT International Search Report and Written Opinion for International Application No. PCT/US2013/039128, mailed Aug. 7, 2013, 10 pages.

European Patent Application No. 13788027.4, European Search Report Dated Dec. 18, 2015, 6 pages.

\* cited by examiner

Position a compliant transfer head over a micro device connected to a carrier substrate, the transfer head comprising: a base substrate; a spring member including: a spring anchor coupled to the base substrate and a spring portion comprising an electrode, wherein the spring portion is deflectable into a space between the spring portion and the base substrate; and a dielectric layer covering a top surface of the electrode.
1710

Contact the micro device with the transfer head
1720

Apply a voltage to the electrode to create a grip force on the micro device
1730

Pick up the micro device with the transfer head
1740

Release the micro device onto a receiving substrate
1750

FIG. 17

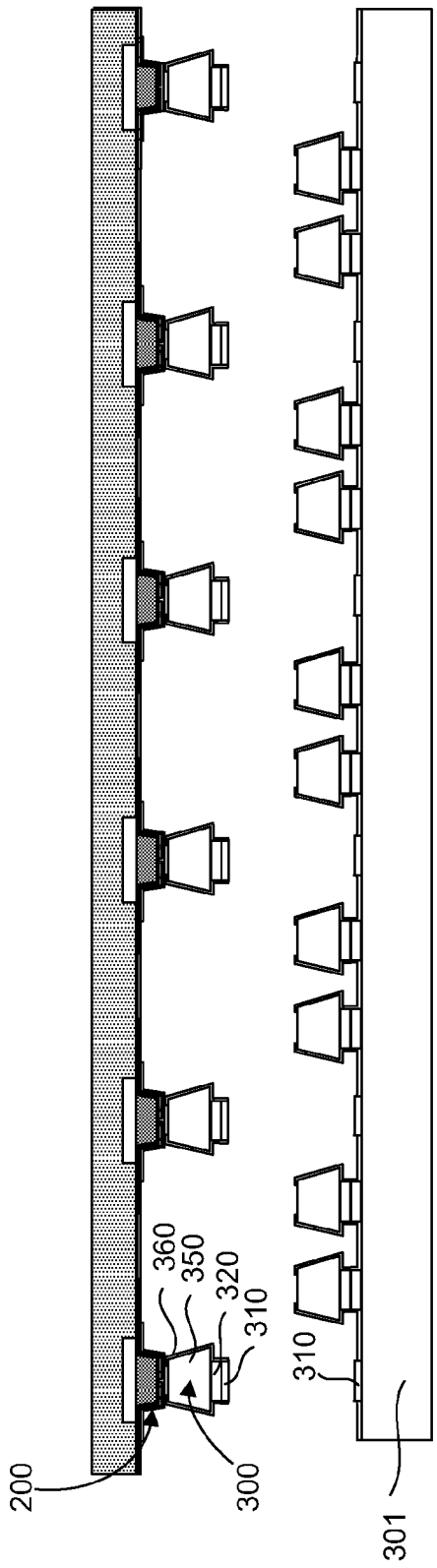
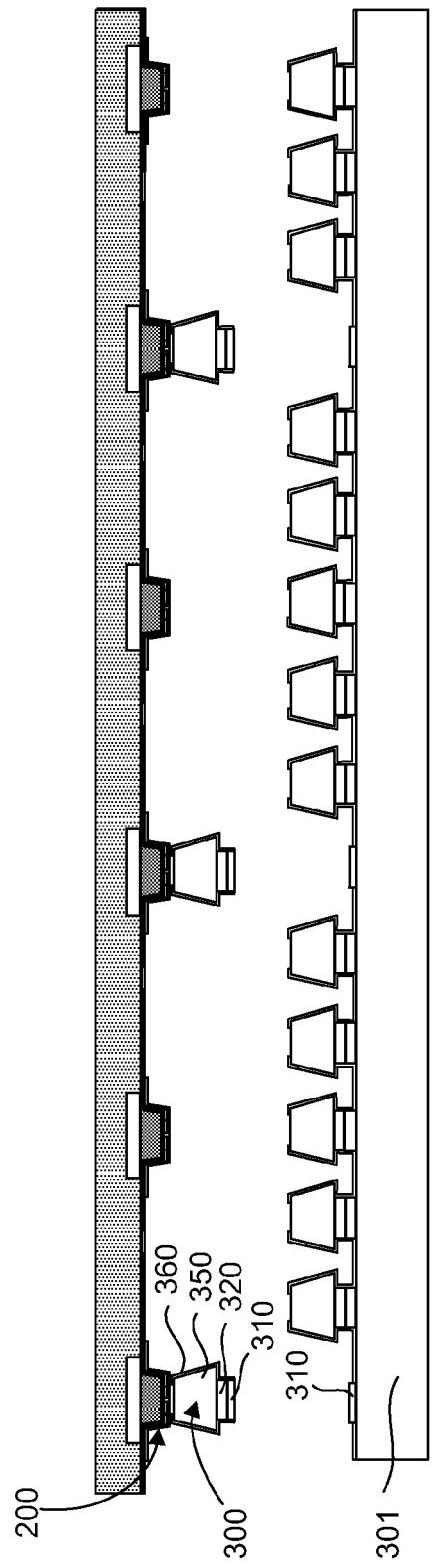

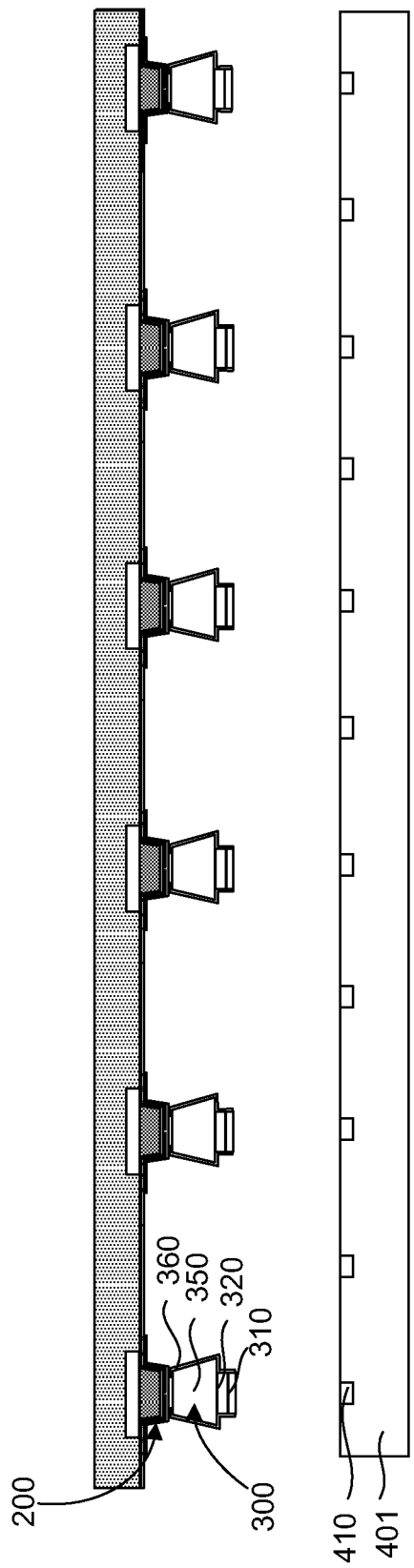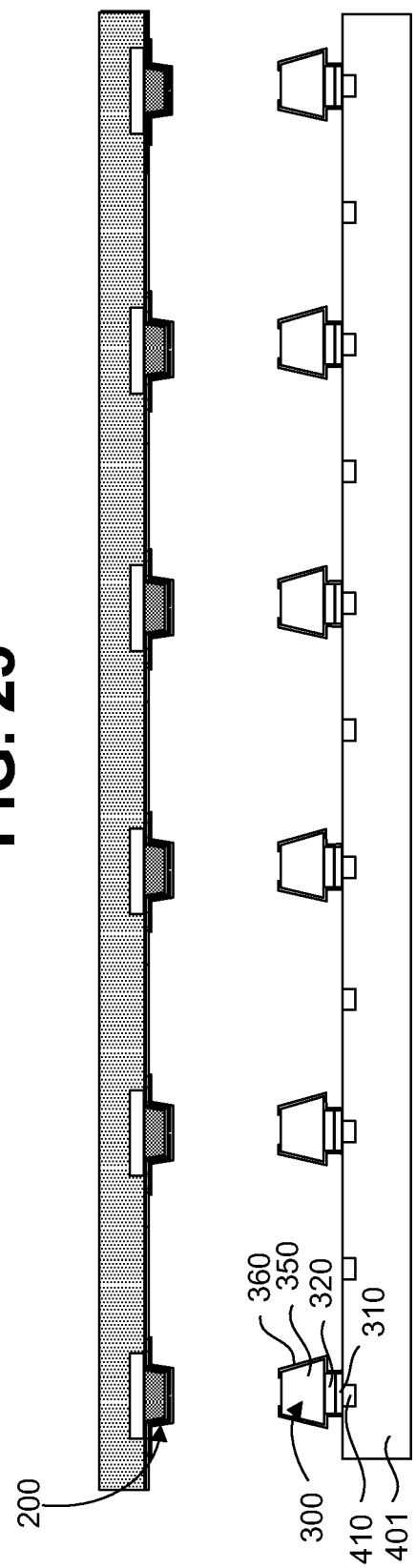

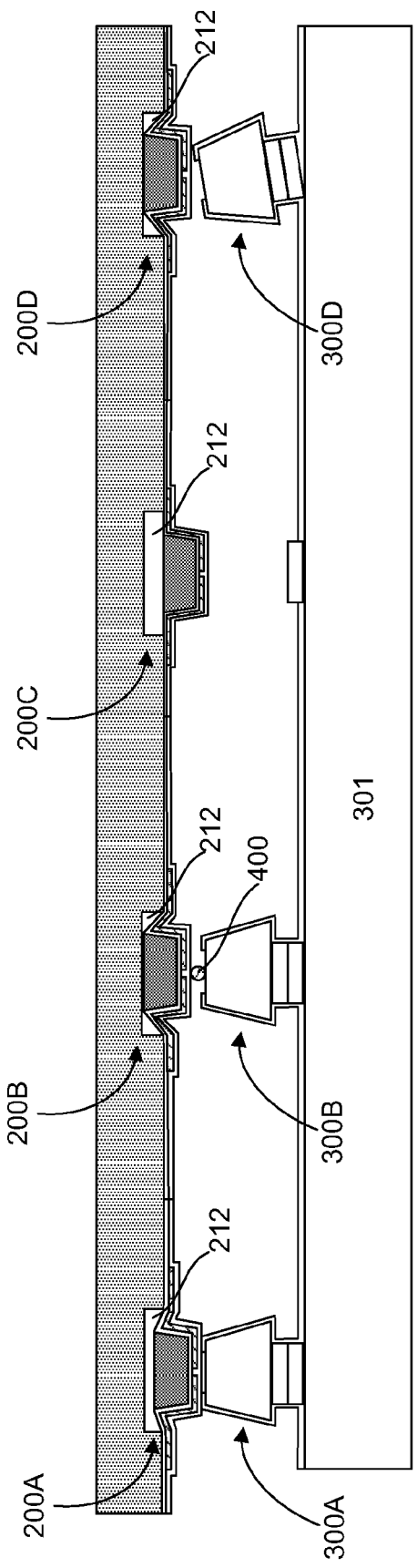
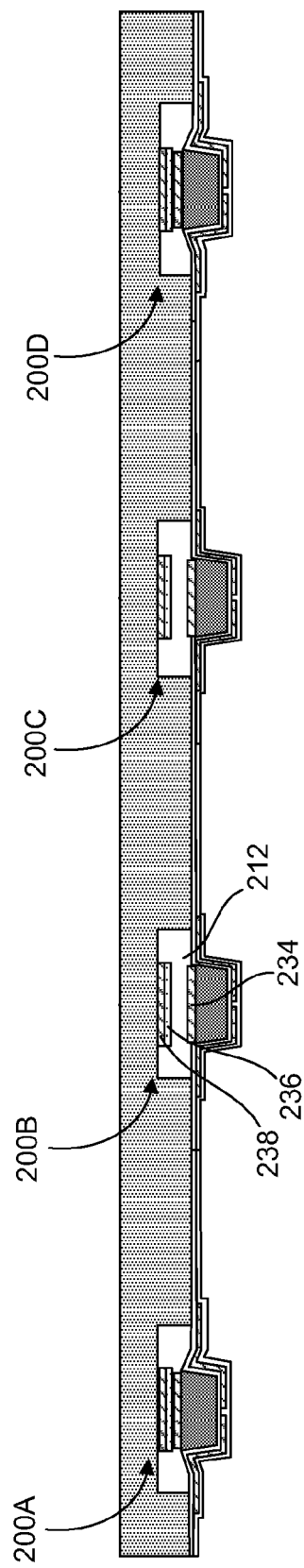
FIG. 30
FIG. 31

COMPLIANT MICRO DEVICE TRANSFER HEAD

RELATED APPLICATIONS

The present application is a continuation of co-pending U.S. patent application Ser. No. 13/466,966 filed May 8, 2012, which is incorporated herein by reference.

BACKGROUND

1. Field

The present invention relates to micro devices. More particularly, embodiments of the present invention relate to a micro device transfer head and a method of transferring an array of micro devices to a different substrate.

2. Background Information

Integration and packaging issues are one of the main obstacles for the commercialization of micro devices such as integration of radio frequency (RF) microelectromechanical systems (MEMS) microswitches, light-emitting diode (LED) integration onto image display systems, and MEMS or quartz-based oscillators.

Traditional technologies for transferring of devices include transfer by wafer bonding from a transfer wafer to a receiving wafer. One such implementation is "direct printing" involving one bonding step of an array of devices from a transfer wafer to a receiving wafer, followed by removal of the transfer wafer. Another such implementation is "transfer printing" involving two bonding/debonding steps. In transfer printing a transfer wafer may pick up an array of devices from a donor wafer, and then bond the array of devices to a receiving wafer, followed by removal of the transfer wafer.

Some printing process variations have been developed where a device can be selectively bonded and debonded during the transfer process. Still, in both traditional and variations of the direct printing and transfer printing technologies, the transfer wafer must be debonded from a device after bonding the device to the receiving wafer. In addition, the entire transfer wafer with the array of devices is involved in the transfer process.

SUMMARY OF THE INVENTION

A compliant micro device transfer head and method of transferring an array of micro devices to a different substrate are disclosed. For example, the receiving substrate may be, but is not limited to, a display substrate, a lighting substrate, a substrate with functional devices such as transistors, or a substrate with metal redistribution lines.

In an embodiment, a micro device transfer head includes a base substrate and a spring member. The spring member includes a spring anchor coupled to the base substrate and a spring portion deflectable into a space between the spring portion and the base substrate. The spring portion also comprises an electrode. A dielectric layer covers a top surface of the electrode. The spring portion may further comprise a mesa structure that protrudes away from the base substrate, where the mesa structure has tapered sidewalls and the electrode is formed on a top surface of the mesa structure. The mesa structure can be separately or integrally formed with the spring portion.

An electrode lead may extend from the electrode in order to make contact with wiring in the base substrate and connect the micro device transfer head to the working electronics of an electrostatic gripper assembly. The electrode leads can run from the electrode on the top surface of the mesa structure and along a sidewall of the mesa structure. The electrode lead can alternatively run underneath the mesa structure and connect to a via running through the mesa structure to the electrode. The spring portion may additionally comprise a second electrode and electrode lead.

In an embodiment, the micro device transfer head comprises a sensor to measure an amount of deflection of the spring portion. The sensor may be coupled to the spring member or formed within the spring member. The sensor may comprise two electrodes, one formed on the bottom surface of the spring member and a second formed directly beneath the first electrode within the space underlying the spring portion of the spring member. The sensor may measure strain or capacitance to determine the amount of deflection of the spring portion. The amount of deflection measured by the sensor may indicate, for example, whether the transfer head has made contact with a micro device, or whether contamination exists between the surfaces of the micro device and the transfer head. In an embodiment, the sensor is configured to measure a resonant frequency of the spring portion in order to determine whether a micro device has been picked up by the transfer head.

The space underlying the spring portion may be a cavity in the surface of the base substrate. Alternatively, the spring portion may be elevated above the base substrate by the spring anchor. The spring member may be a spring arm having a first end coupled to the base substrate or spring anchor, and a second end suspended above the cavity, wherein the spring anchor comprises the first end and the spring portion comprises the second end. A mesa structure may be formed on the second end of the spring arm. The spring member may comprise multiple spring arms. Alternatively, the spring portion may also completely cover the cavity. The mesa structure may be formed on the top surface of the spring portion, over a center of the cavity.

In an embodiment, a method for selective transfer of micro devices includes bringing an array of compliant micro device transfer heads, each comprising a deflection sensor, into contact with an array of micro devices. The amount of deflection of each transfer head may then be measured, and each transfer head may be selectively activated based on the amount of deflection detected by a sensor in the transfer head, such that only those transfer heads whose deflection indicates contact with the surface of a micro device are activated in order to pick up the corresponding micro device.

In an embodiment, a method for selective pick up of an array of micro devices includes an array of micro device transfer heads where each transfer head includes an electrode on a backside of the spring portion and a corresponding electrode at the bottom of a cavity, opposite the backside electrode. One of the backside or opposing electrodes may be covered by a dielectric layer to prevent shorting. When a transfer head is depressed, a voltage may be applied across the two electrodes to lock the transfer head in the depressed position. To enable selective transfer, the transfer heads in an array may first be depressed and locked in the depressed position. The voltage may then be selectively removed from a portion of the transfer heads, releasing the selected transfer heads from the depressed position so that they are poised to pick up micro devices. The transfer head array may be positioned above an array of micro devices on a carrier substrate, and brought into contact so that only the selectively released transfer heads contact and pick up a corresponding portion of micro devices.

BRIEF DESCRIPTION OF THE DRAWINGS

FIG. 17 is a flow chart illustrating a method of picking up and transferring a micro device from a carrier substrate to a receiving substrate in accordance with an embodiment of the invention.

FIG. 23 is a cross-sectional side view illustration of an array of micro device transfer heads picking up an array of micro LED devices in accordance with an embodiment of the invention.

FIG. 24 is a cross-sectional side view illustration of an array of micro device transfer heads picking up a portion of an array of micro LED devices in accordance with an embodiment of the invention.

FIG. 25 is a cross-sectional side view illustration of an array of micro device transfer heads with an array of micro LED devices positioned over a receiving substrate in accordance with an embodiment of the invention.

FIG. 26 is a cross-sectional side view illustration of an array of micro devices released onto a receiving substrate in accordance with an embodiment of the invention.

FIG. 30 is a cross-sectional side view illustration of an array of micro device transfer heads illustrating varying degrees of deflection of the spring portion of a transfer head during a pick up operation.

FIG. 31 is a cross-sectional side view illustration of an array of micro device transfer heads where a portion of the transfer heads have been locked in the depressed position.

DETAILED DESCRIPTION OF THE INVENTION

Figure 1:
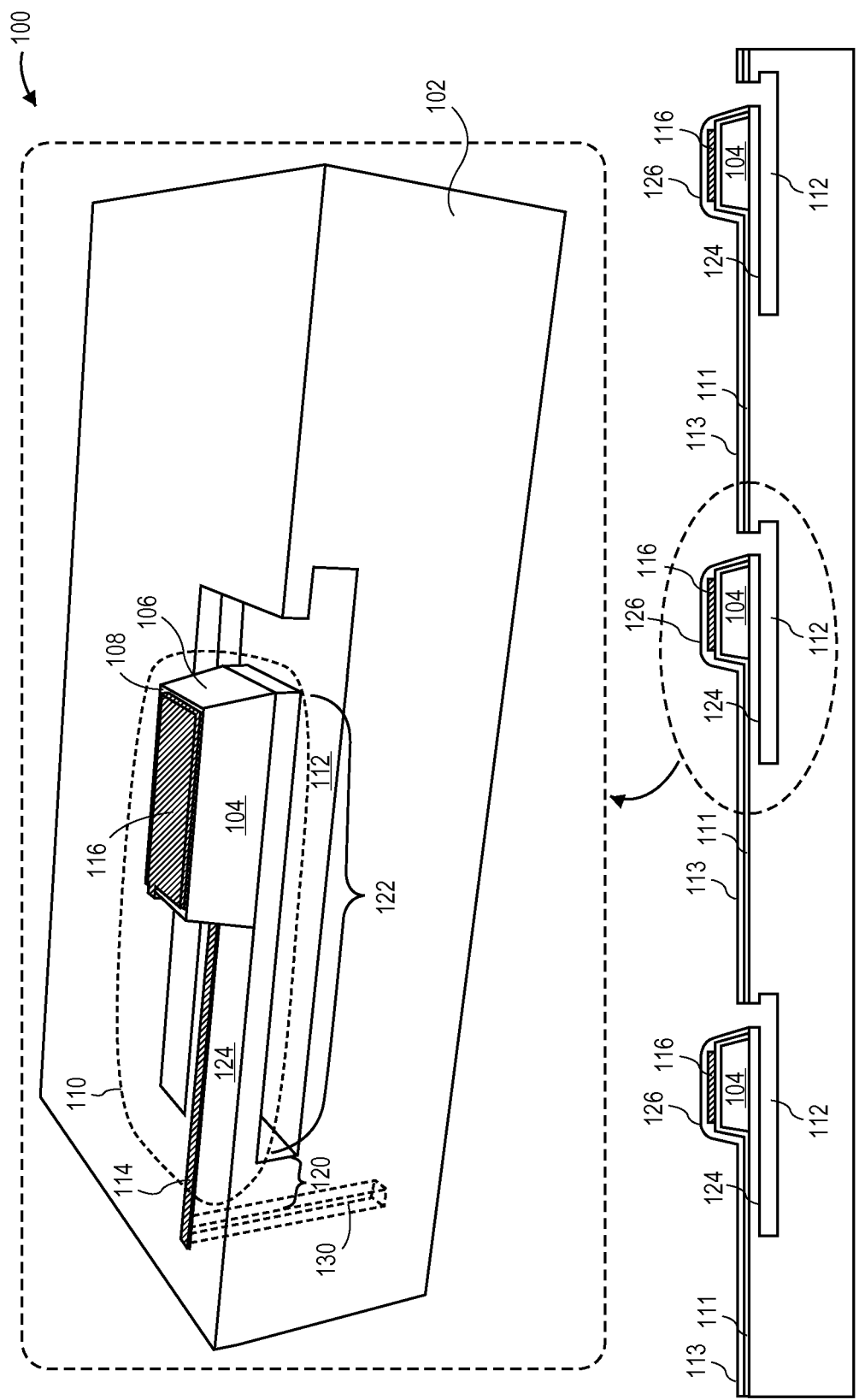
FIG. 1 is a cross-sectional side view and isometric illustration of a bipolar cantilever micro device transfer head in accordance with an embodiment of the invention.

Embodiments of the present invention describe a compliant micro device transfer head and head array, and a method of transferring a micro device and an array of micro devices from a carrier substrate to a receiving substrate. The receiving substrate may be, but is not limited to, a display substrate, a lighting substrate, a substrate with functional devices such as transistors or integrated circuits (ICs), or a substrate with metal redistribution lines. In some embodiments, the micro devices and array of micro devices described herein may be a micro LED device, such as the structures illustrated in FIGS. 26-28 and those described in related U.S. patent application Ser. No. 13/372,222, which is incorporated herein by reference. While some embodiments of the present invention are described with specific regard to micro LEDs, it is to be appreciated that embodiments of the invention are not so limited and that certain embodiments may also be applicable to other micro devices such as diodes, transistors, integrated circuits (ICs), and MEMS.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "an embodiment" or the like in various places throughout this specification are not necessarily referring to the same embodiment of the invention. Furthermore, the particular features, structures, configurations, or characteristics may be combined in any suitable manner in one or more embodiments.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device or "micro" LED structure as used herein may refer to the descriptive size of certain devices or structures in accordance with embodiments of the invention. As used herein, the terms "micro" devices or structures are meant to refer to the scale of 1 to 100 µm. However, it is to be appreciated that embodiments of the present invention are not necessarily so limited, and that certain aspects of the embodiments may be applicable to larger, and possibly smaller size scales.

In one aspect, embodiments of the invention describe a manner for mass transfer of an array of pre-fabricated micro devices with an array of compliant transfer heads. For example, the pre-fabricated micro devices may have a specific functionality such as, but not limited to, an LED for light-emission, silicon IC for logic and memory, and gallium arsenide (GaAs) circuits for radio frequency (RF) communications. In some embodiments, arrays of micro LED devices which are poised for pick up are described as having a 10 µm by 10 µm pitch, or 5 µm by 5 µm pitch. At these densities a 6 inch substrate, for example, can accommodate approximately 165 million micro LED devices with a 10 µm by 10 µm pitch, or approximately 660 million micro LED devices with a 5 µm by 5 µm pitch. A transfer tool including an array of compliant transfer heads matching an integer multiple of the pitch of the corresponding array of micro LED devices can be used to pick up and transfer the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of micro device transfer heads can pick up and transfer more than 100,000 micro devices, with larger arrays of micro device transfer heads being capable of transferring more micro devices. Each compliant transfer head in the array of compliant transfer heads may also be independently controllable, which enables selective pick up and release of the micro devices.

In one aspect, embodiments of the invention describe a compliant micro device transfer head and a method of transfer in which an array of the micro device transfer heads enable improved contact with an array of micro devices as compared to an array of incompliant transfer heads. An array of compliant micro device transfer heads, wherein each transfer head includes a spring member, is lowered onto an array of micro devices until the transfer heads make contact with the micro devices. The spring member components of the compliant transfer heads can compensate for variations in height of the micro devices or for particulate contamination on top of a micro device. For example, without the spring members it is possible that an array of transfer heads would not make contact with each and every micro device in the array. An irregular micro device height or a particle on a top surface of a single micro device could prevent the remainder of the transfer heads from making contact with the remainder of the micro devices in the array. As a result, an air gap could be formed between those transfer heads and micro devices. With such an air gap, it is possible that the target applied voltage would not create a sufficient electrostatic force to overcome the air gap, resulting in an incomplete pick-up process. In accordance with embodiments of the invention, the spring members associated with taller or contaminated micro devices may deflect more than spring members associated with shorter micro devices on a single transfer substrate. In this manner, the spring members can also compensate for variations in height of the micro devices, assisting each compliant transfer head to make contact with each micro device, and ensure that each intended micro device is picked up.

In one aspect, the compliant micro device transfer head structure includes a sensor to monitor an amount of deflection of the spring member when the transfer head is brought into contact with a micro device. The sensor may be used for a variety of reasons. In one application, the sensor can be used to determine if contact has been made with a respective micro device. In another application, the sensor can be used to detect an irregularly shaped or contaminated micro device. In this manner, it may be determined whether to proceed to attempt to pick up the irregular or contaminated micro device. Additionally, it may be determined whether to apply a cleaning operation to the transfer head array or micro device array prior to reattempting a pick up operation. In another application, the sensor can be used to detect whether a micro device is attached to the transfer head, and has successfully been picked up.

In another aspect, a method for selective transfer of micro devices includes bringing an array of compliant micro device transfer heads, each comprising a deflection sensor, into contact with an array of micro devices. The amount of deflection of each transfer head may be measured by the deflection sensor to determine whether the transfer head has contacted a micro device, to indicate the presence of contamination or irregularities on the surface of the micro device, or indicate the absence of a micro device. As such, each transfer head may be selectively activated based on the amount of deflection detected by the deflection sensor, so that only those transfer heads whose deflection indicate contact with the surface of a micro device are activated to pick up the corresponding micro device.

In another aspect, a method for selective transfer of micro devices includes depressing the compliant transfer heads in an array, locking the transfer heads in the depressed position, and then selectively releasing a portion of the transfer heads from the depressed position so that each released transfer head may contact and pick up a corresponding micro device in an array of micro devices.

Figure 2:
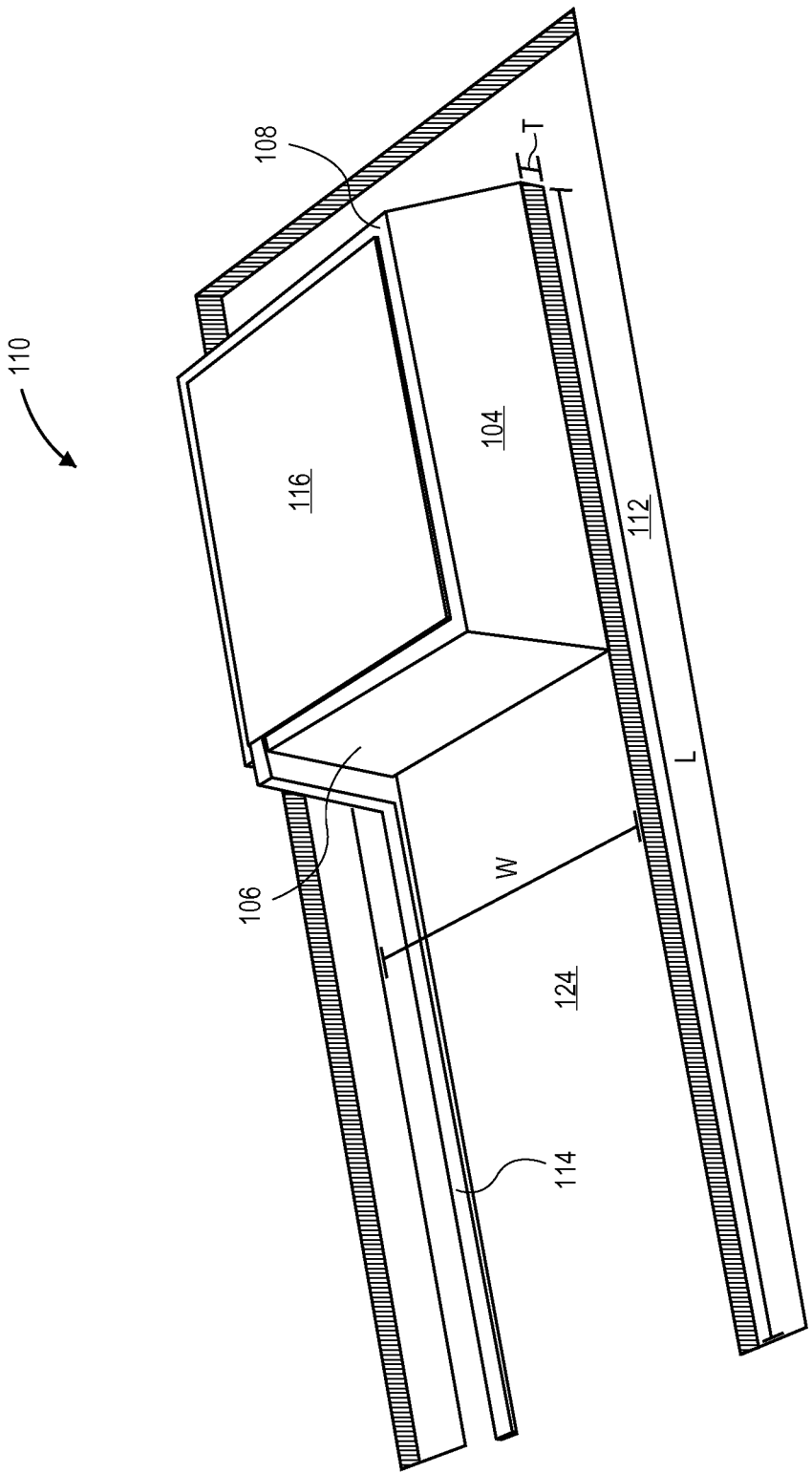
FIG. 2 is an isometric illustration of a monopolar cantilever micro device transfer head in accordance with an embodiment of the invention.

Referring now to FIG. 1, an isometric view of a compliant transfer head 100 with a monopolar electrode and a corresponding cross-sectional side view of a compliant transfer head array are illustrated in accordance with an embodiment of the invention. FIG. 2 is a close-up isometric view of the spring member 110 shown in FIG. 1. The spring member feature of the micro device transfer head disclosed herein may be executed using a variety of structures that enable deflection of the transfer head. Exemplary embodiments include a cantilever beam (see, e.g., FIG. 1), multiple spring arms (see, e.g., FIG. 10), a membrane (see, e.g., FIG. 11), and elevated platforms (see, e.g., FIGS. 16A-D). Other structures may be possible to enable a compliant transfer head. Additional features of a particular embodiment of a transfer head may be determined by the structure of the spring member, such as the addition of a mesa structure, the placement of electrode leads, and the type and location of deflection sensors. Accordingly, though features—such as the materials and characteristics of the base substrate, spring member, electrode(s), and dielectric layer—are described with reference to the cantilever spring member structure shown in FIGS. 1 and 2, it is to be understood that certain features are equally applicable to other spring member structure embodiments subsequently described.

Each transfer head may include a base substrate 102, a spring member 110 comprising a spring anchor 120 coupled to the base substrate 102 and a spring portion 122 comprising electrode 116, and a dielectric layer 113 covering the top surface of the electrode. The spring portion 122 is deflectable into a space 112 between the spring portion 122 and the base substrate 102. The dielectric layer 113 is not shown in the isometric view illustrations in FIGS. 1-2 so that the underlying elements may be illustrated. Spring portion 122 may include a spring arm 124 and a mesa 104 including a top surface 108 and tapered sidewalls 106.

Base substrate 102 may be formed from a variety of materials such as silicon, ceramics and polymers that are capable of providing structural support. In an embodiment, base substrate 102 has a conductivity between $10^3$ and $10^{18}$ ohm-cm. Base substrate 102 may additionally include interconnect 130 to connect the micro device transfer head 100 to the working electronics of an electrostatic gripper assembly via electrode lead 114.

Referring again to FIG. 1, spring portion 122 of spring member 110 is deflectable into a space 112 separating spring portion 122 from the base substrate 102. In an embodiment, one end of spring member 110 comprises the spring anchor 120, by which spring member 110 is coupled to base substrate 102, and the other end comprises the spring portion 122 suspended above space 112. In an embodiment, spring portion 122 comprises spring arm 124, mesa structure 104, electrode 116, and electrode lead 114. Spring arm 124 is formed from a material having an elastic modulus that enables deflection of spring portion 122 into space 112 over the working temperature range of the micro device transfer process. In an embodiment, spring arm 124 is formed from the same or different material as base substrate 102, for example, semiconductor materials such as silicon or dielectric materials such as silicon dioxide and silicon nitride. In an embodiment, spring arm 124 is integrally formed from base substrate 102, such as, during the etching of space 112. In another embodiment, spring arm 124 is formed from a layer of material deposited, grown, or bonded onto base substrate 102.

In an embodiment, the material and dimensions of spring arm 124 are selected to enable spring portion 122 to deflect approximately 0.5 μm into space 112 when the top surface of transfer head 100 is subjected to up to 10 atm of pressure at operating temperatures up to 350° C. Referring to FIG. 2, spring arm 124 has a thickness T, width W, and length L, according to an embodiment of the invention. In an embodiment, spring arm 124 is formed from silicon and has a thickness T of up to 1 μm. The thickness T of spring arm 124 may be greater or less than 1 μm, depending on the elastic modulus of the material from which it is formed. In an embodiment, the width W of spring arm 124 is sufficient to accommodate additional spring portion and transfer head elements, such as electrode 116 and mesa structure 104. In an embodiment, the width W of spring arm 124 may correspond to the size of the micro device to be picked up. For example, where a micro device is 3-5 μm wide, the width of the spring arm may also be 3-5 μm, and where a micro device is 8-10 μm wide, the width of the spring arm may also be 8-10 μm. The length L of spring arm 124 is long enough to enable deflection of spring portion 122 given the modulus of the material from which spring arm 124 is formed, but less than the pitch of the transfer heads 100 in the transfer head array. In an embodiment, the length L of spring arm 124 may be from 8 to 30 μm.

Spring portion 122 of the cantilever spring member 110 shown in FIGS. 1 and 2 further includes mesa structure 104 protruding away from base substrate 102. Mesa structure 104 has tapered sidewalls 106 and top surface 108. Mesa structure 104 may be formed using any suitable processing technique, and may be formed from the same or different material than spring arm 124. In one embodiment, mesa structure 104 is integrally formed with spring arm 124, for example by using casting or lithographic patterning and etching techniques. In an embodiment, anisotropic etching techniques can be utilized to form tapered sidewalls 106 for mesa structure 104. In another embodiment, mesa structure 104 may be deposited or grown, and patterned on top of the base substrate 102. In an embodiment, mesa structure 104 is a patterned oxide layer, such as silicon dioxide, formed on a silicon spring arm 124.

In one aspect, the mesa structures 104 generate a profile that protrudes away from the base substrate so as to provide a localized contact point to pick up a specific micro device during a pick up operation. In an embodiment, mesa structures 104 have a height of approximately 1 μm to 5 μm, or more specifically approximately 2 μm. Specific dimensions of the mesa structures 104 may depend upon the specific dimensions of the micro devices to be picked up, as well as the thickness of any layers formed over the mesa structures. In an embodiment, the height, width, and planarity of the array of mesa structures 104 on the base substrate 102 are uniform across the base substrate so that each micro device transfer head 100 is capable of making contact with each corresponding micro device during the pick up operation. In an embodiment, the width across the top surface 126 of each micro device transfer head is slightly larger, approximately the same, or less than the width of the top surface of the each micro device in the corresponding micro device array so that a transfer head does not inadvertently make contact with a micro device adjacent to the intended corresponding micro device during the pick up operation. As described in further detail below, since additional layers may be formed over the mesa structure 104 (e.g. passivation layer 111, electrode 116, and dielectric layer 113) the width of the mesa structure may account for the thickness of the overlying layers so that the width across the top surface 126 of each micro device transfer head is slightly larger, approximately the same, or less than the width of the top surface of the each micro device in the corresponding micro device array.

Still referring to FIGS. 1 and 2, mesa structure 104 has a top surface 108, which may be planar, and sidewalls 106. In an embodiment, sidewalls 106 may be tapered up to 10 degrees, for example. Tapering the sidewalls 106 may be beneficial in forming the electrodes 116 and electrode leads 114 as described further below. A passivation layer 111 may cover the base substrate 102 and array of spring arms 124 and mesa structures 104. In an embodiment, the passivation layer may be 0.5 μm-2.0 μm thick oxide such as, but not limited to, silicon oxide ($SiO_2$), aluminum oxide ($Al_2O_3$) or tantalum oxide ($Ta_2O_5$).

Spring member 110 further comprises electrode 116 and electrode lead 114, according to an embodiment. In an embodiment, electrode 116 is formed on the top surface 108 of mesa structure 104. In an exemplary embodiment, the top surface 108 of the mesa structure 104 onto which electrode 116 is formed is approximately 7 μm×7 μm in order to achieve a 8 μm×8 μm top surface of the transfer head 100. In accordance with an embodiment, electrode 116 covers the maximum amount of surface area of the top surface 108 of the mesa structure 104 as possible while remaining within patterning tolerances. Minimizing the amount of free space increases the capacitance and resultant grip pressure that can be achieved by the micro device transfer head. While a certain amount of free space is illustrated on the top surface 108 of the mesa structure 104 in FIGS. 1 and 2, electrode 116 may cover the entire top surface 108. The electrode 116 may also be slightly larger than the top surface 108, and partially or fully extend down the sidewalls 106 of the mesa structure 104 to ensure complete coverage of the top surface 108. It is to be appreciated that the mesa array may have a variety of different pitches, and that embodiments of the invention are not limited to the exemplary 7 μm×7 μm top surface of the mesa structure 104 in a 10 μm pitch.

Electrode lead 114 may run from electrode 116 over the top surface 108 of mesa structure 104, down sidewall 106 of the mesa structure, along the top surface of spring arm 124, and over spring anchor 120. In an embodiment, electrode lead 114 connects to interconnect 130 in base substrate 102, which may run through the base substrate to a back side of the base substrate.

A variety of conductive materials including metals, metal alloys, refractory metals, and refractory metal alloys may be employed to form electrode 116 and electrode lead 114. In an embodiment, electrode 116 has a thickness up to 5,000 Å (0.5 μm). In an embodiment, the electrode 116 includes a high melting temperature metal such as platinum or a refractory metal or refractory metal alloy. For example, an electrode may include platinum, titanium, vanadium, chromium, zirconium, niobium, molybdenum, ruthenium, rhodium, hafnium, tantalum, tungsten, rhenium, osmium, iridium and alloys thereof. Refractory metals and refractory metal alloys generally exhibit higher resistance to heat and wear than other metals. In an embodiment, electrodes 116 are each an approximately 500 Å (0.05 μm) thick layer of titanium tungsten (TiW) refractory metal alloy.

In an embodiment, a dielectric layer 113 covers electrode 116. The dielectric layer 113 may also cover other exposed layers on transfer head 100 and base substrate 102. In an embodiment, the dielectric layer 113 has a suitable thickness and dielectric constant for achieving the required grip pressure of the micro device transfer head 100, and sufficient dielectric strength to not break down at the operating voltage. The dielectric layer 113 may be a single layer or multiple layers. In an embodiment, the dielectric layer is 0.5 μm-2.0 μm thick, though the thickness may be more or less depending upon the specific topography of the transfer head 100 and underlying mesa structure 104. Suitable dielectric materials may include, but are not limited to, aluminum oxide ($Al_2O_3$) and tantalum oxide ($Ta_2O_5$). In accordance with embodiments of the invention, the dielectric layer 113 possesses a dielectric strength greater than the applied electric field so as to avoid shorting of the transfer head during operation. The dielectric layer 113 can be deposited by a variety of suitable techniques such as chemical vapor deposition (CVD), atomic layer deposition (ALD) and physical vapor deposition (PVD) such as sputtering. The dielectric layer 113 may additionally be annealed following deposition. In one embodiment, the dielectric layer 113 possesses a dielectric strength of at least 400 V/μm. Such a high dielectric strength can allow for the use of a thinner dielectric layer. Techniques such as ALD can be utilized to deposit uniform, conformal, dense, and/or pin-hole free dielectric layers with good dielectric strength. Multiple layers can also be utilized to achieve such a pin-hole free dielectric layer. Multiple layers of different dielectric materials may also be utilized to form dielectric layer 113. In an embodiment, the underlying electrode 116 includes platinum or a refractory metal or refractory metal alloy possessing a melting temperature above the deposition temperature of the dielectric layer material(s) so as to not be a limiting factor in selecting the deposition temperature of the dielectric layer 113. In an embodiment, following the deposition of the dielectric layer 113, a thin coating (not illustrated) may be formed over the dielectric layer 113 to provide a specific stiction coefficient, so as to add lateral friction and keep the micro devices from being knocked off the transfer head during the pick up operation. In such an embodiment, the additional thin coating replaces top surface 126 as the contacting surface, and this surface retains the dimensional array requirements described herein. Furthermore, the additional coating can affect the dielectric properties of the micro device transfer head which may affect the operability of the micro device transfer head. In an embodiment, the additional coating thickness can be minimal (e.g. below 10 nm) so as to have little to no appreciable effect on the grip pressure.

Spring portion 122 is deflectable into the space 112 between spring portion 122 and base substrate 102. In an embodiment, space 112 is a cavity in the surface of base substrate 102. In another embodiment, spring portion 122 is elevated above base substrate 102 to create space 112. In an embodiment, space 112 extends underneath the spring arm 124 of spring portion 122. Space 112 may also comprise an undercut portion beneath the top surface of base substrate 102. The dimensions of space 112 are selected to enable deflection of spring portion 122 into space 112, as discussed above with respect to spring arm 124.

Figure 3:
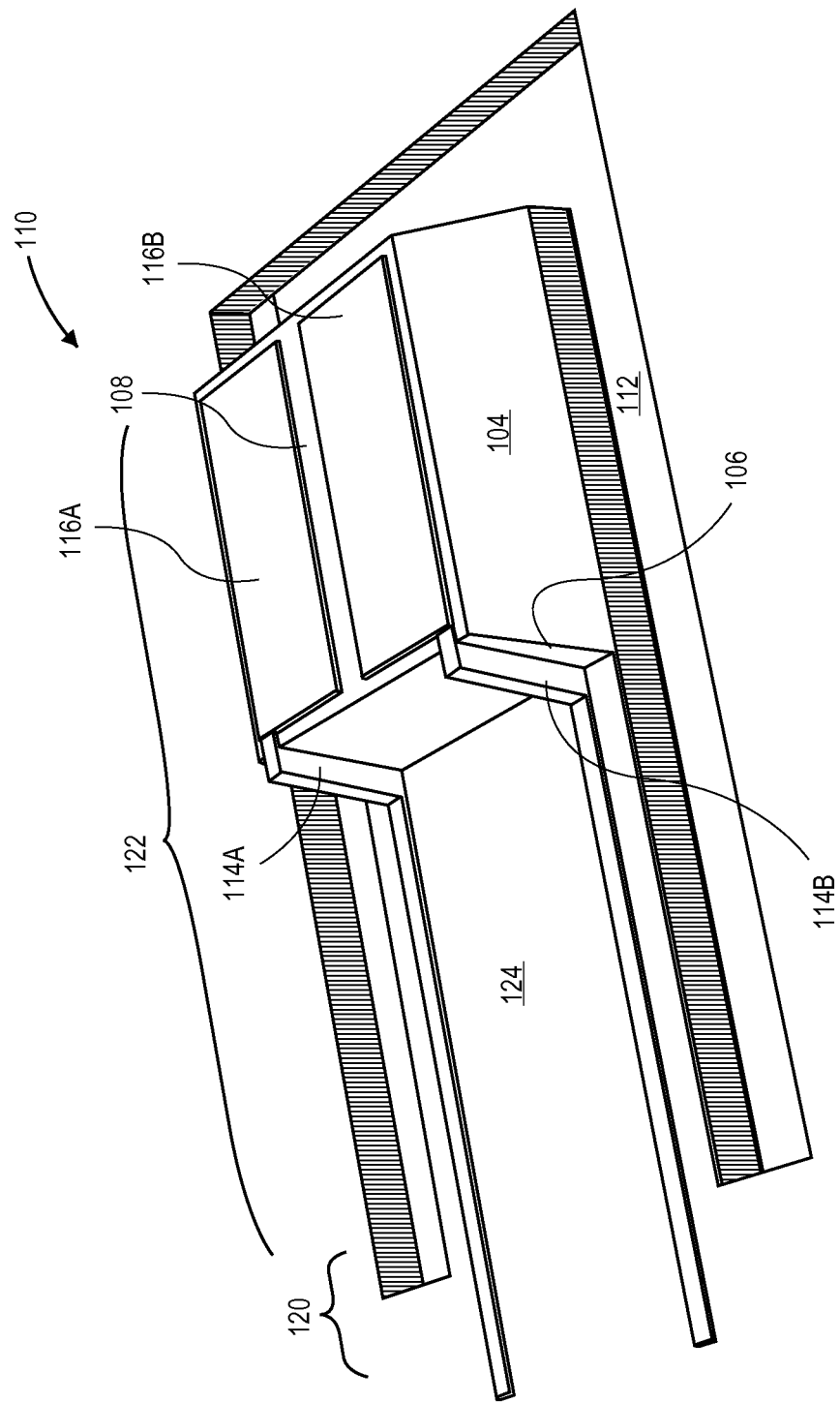
FIG. 3 is an isometric illustration of a bipolar cantilever micro device transfer head in accordance with an embodiment of the invention.

FIG. 3 is a close-up isometric view of a spring member 110 having a bipolar electrode, according to an embodiment of the invention. In an embodiment, electrodes 116A and 116B cover mesa structure 104. For purposes of clarity, the overlying dielectric layer is not illustrated. In an embodiment, electrodes 116A and 116B are formed over a passivation layer (not shown) that covers mesa structure 104. In an exemplary embodiment, where the top surface 108 of the mesa structure 104 is approximately 7 μm×7 μm corresponding to a mesa array with a 10 μm pitch, the electrodes may cover the maximum amount of the surface area of the top surface 108 of the mesa structure 104 as possible while still providing separation between electrodes 116A, 116B. The minimum amount of separation distance may be balanced by considerations for maximizing surface area, while avoiding overlapping electric fields from the electrodes. For example, the electrodes 116A, 116B may be separated by 0.5 μm or less, and the minimum separation distance may be limited by the height of the electrodes. In an embodiment, the electrodes are longer than the top surface 108 in one direction, and partially or fully extend down the sidewalls 106 of the mesa structure 104 to ensure maximum coverage of the top surface 108. It is to be appreciated that the mesa array may have a variety of different pitches, and that embodiments of the invention are not limited to the exemplary 7 μm×7 μm top surface of the mesa structure 104 in a 10 μm pitch.

Figure 4:
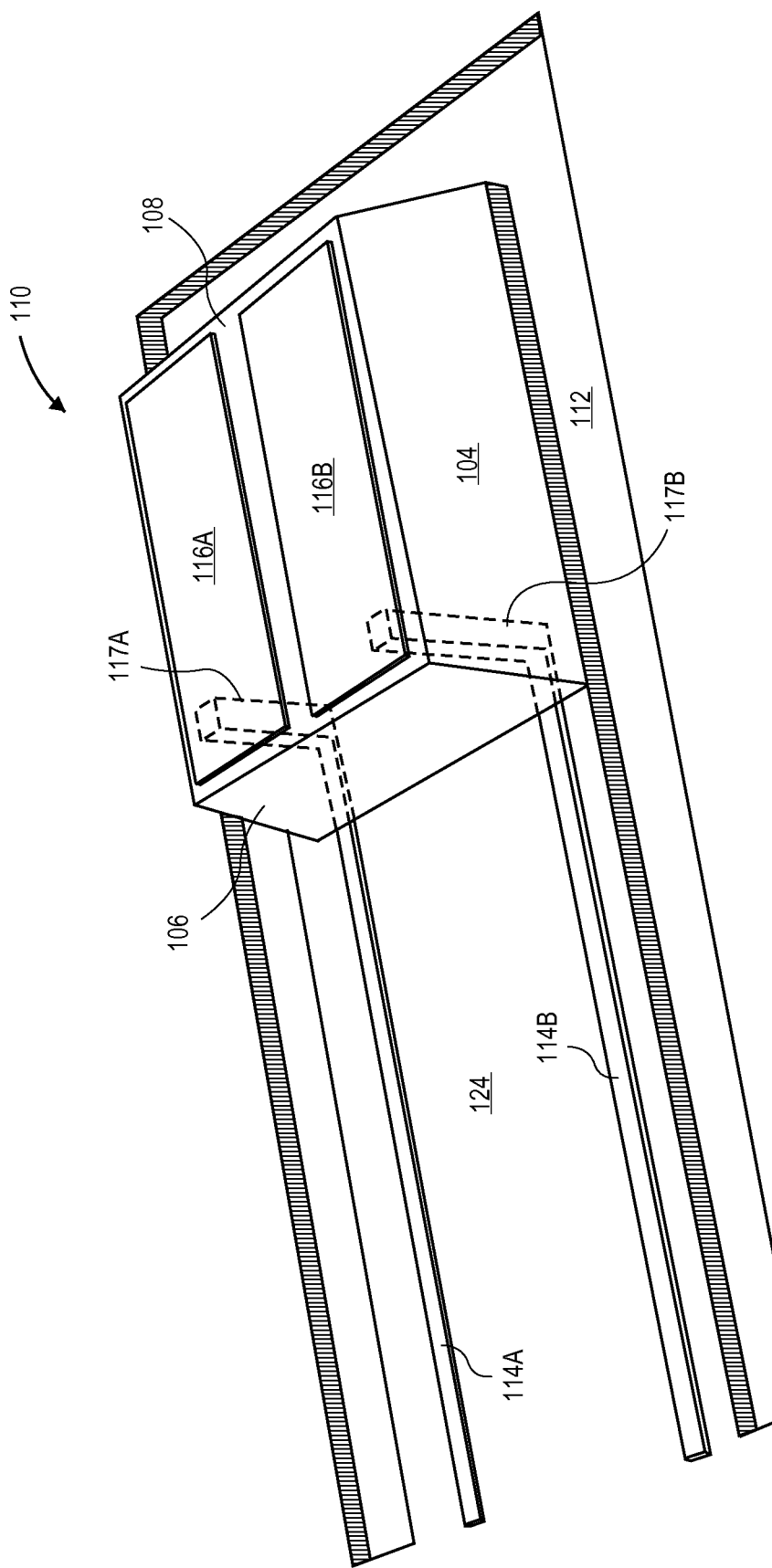
FIG. 4 is an isometric illustration of a cantilever bipolar micro device transfer head including conductive vias in accordance with an embodiment of the invention.

Electrode leads 114A and 114B connect to electrodes 116A and 116B, respectively, on the top surface 108 of mesa structure 104. Electrodes 114 may run down a single inclined sidewall 106 of mesa structure 104 and along the top surface of spring arm 124 to spring anchor 120. The incline of sidewall 106 aids in the deposition and etching of metal to form electrode leads 114. In an embodiment, electrode leads 114A and 114B are each located in proximity to the edges of spring arm 124 so as to permit the formation of a spring arm sensor (not shown) between the electrode leads, on the top surface of spring arm 124. Electrode leads 114A, 114B may be formed of the same or different conductive material as electrodes 116A, 116B Referring now to FIG. 4, an isometric view is provided of a spring member 110 having a bipolar electrode with an alternative electrode lead configuration in accordance with an embodiment of the invention. In such an embodiment the electrode leads 114A, 114B run underneath a portion of the mesa structure 104, and conductive vias 117A, 117B run through the mesa structure 104 (and an optional passivation layer not illustrated) connecting the electrodes 116A, 116B to the respective electrode leads 114A, 114B. In such an embodiment, conductive vias 117A, 117B may be formed prior to formation of mesa structure 104, and may be formed of the same or different conductive material as electrode leads 114A, 114B and electrodes 116A, 116B. While vias 117A, 117B are illustrated with regard to a bipolar electrode structure in FIG. 4, it is to be appreciated that the above described via or vias may also be integrated into monopolar electrode structures.

Figure 5A:
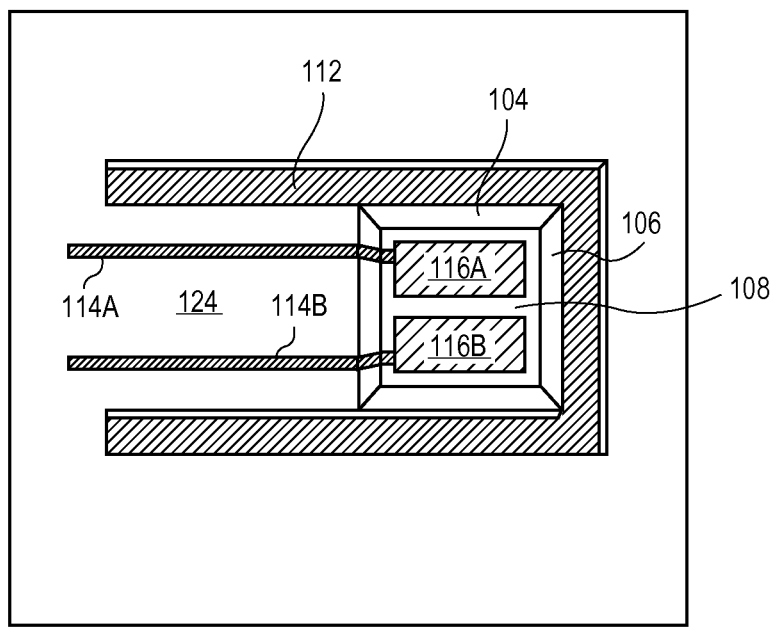
FIGS. 5A-B are top-down illustrations of a bipolar cantilever micro device transfer head in accordance with an embodiment of the invention.
Figure 5B:
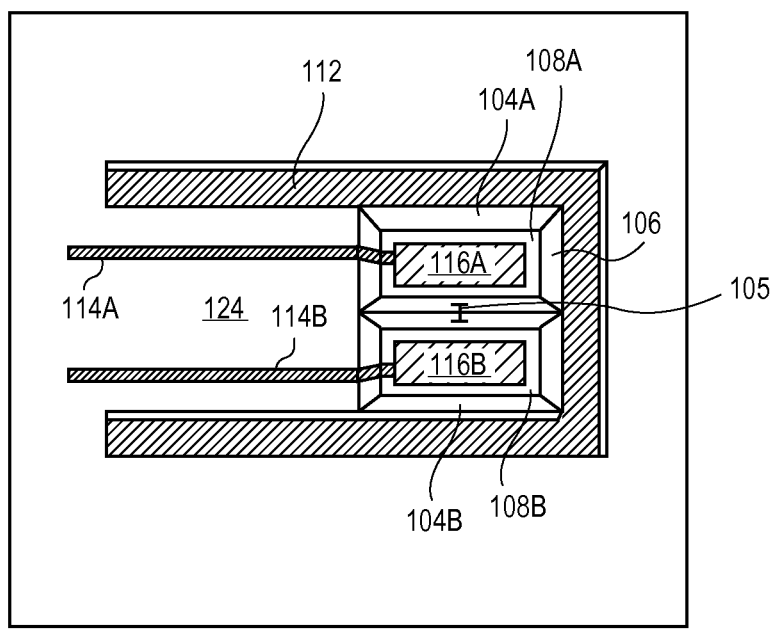

Referring now to FIGS. 5A-B, top view illustrations of electrodes 116A, 116B of a bipolar micro device transfer head are provided in accordance with embodiments of the invention. Thus far, mesa structure 104 has been described as a single mesa structure as shown in FIG. 5A. However, embodiments of the invention are not so limited. In the embodiment illustrated in FIG. 5B, each electrode 116 is formed on a separate mesa structure 104A, 104B separated by a trench 105. An optional passivation layer (not illustrated) may cover both mesa structures 104A, 104B.

FIGS. 6A-D each illustrate an embodiment of a micro device transfer head 100 incorporating one or more sensors. Sensors can serve a variety of purposes during operation of the transfer head. For example, where a sensor is used to measure an amount of deflection of the transfer head, this information can be used to determine if (1) contact has been made with a micro device to be picked up, (2) contamination is present on the micro device, or alternatively the micro device has been damaged or deformed, or (3) whether a micro device has been picked up.

Figure 6A:
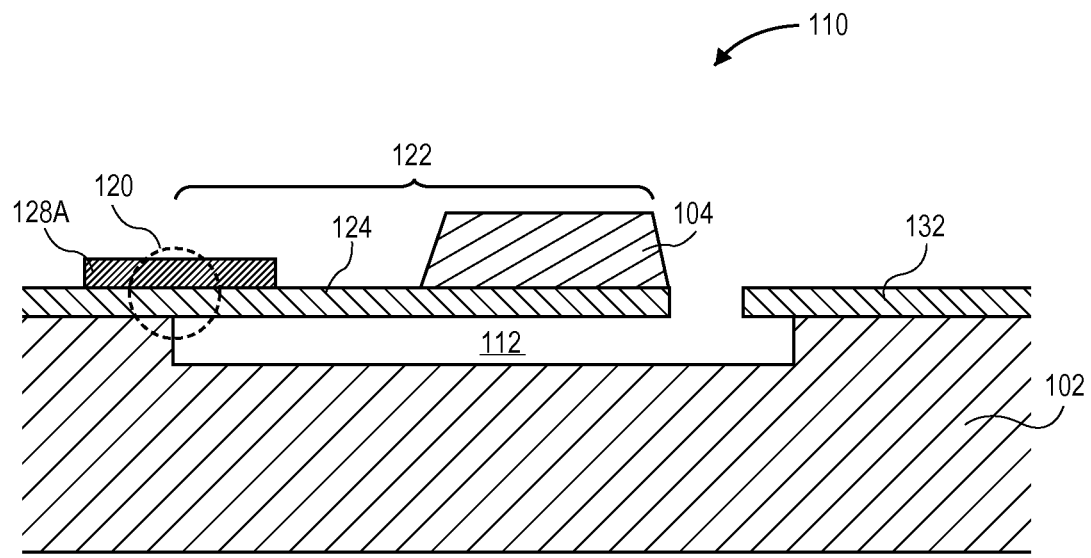
FIGS. 6A-D are cross-sectional side view illustrations of sensor components of a cantilever micro device transfer head in accordance with an embodiment of the invention.
Figure 6B:
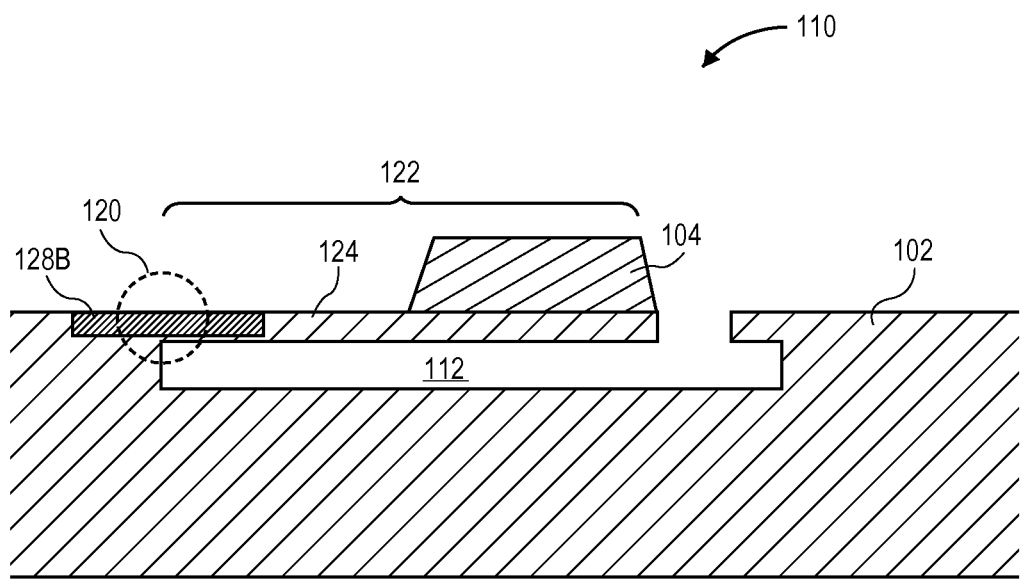

FIGS. 6A-B illustrate cross sectional side views of a transfer head comprising a strain sensor 128A/128B, according to an embodiment of the invention. In an embodiment, strain sensor 128A/128B is a strain gauge capable of measuring the amount of deflection of spring portion 122 into space 112. When a transfer head contacts the surface of a micro device during a pick up operation, it may deflect some amount in response to the contact pressure. By measuring the amount of deflection of a spring portion 122 and comparing it to the amount of deflection known to indicate clean contact with a micro device surface, strain sensor 128A/128B can indicate whether transfer head 100 has contacted the top surface of a micro device in an array and as such is ready to execute a pick up operation. Detection of too little deflection may indicate that a micro device is absent from that position in the array, while detection of too much deflection may indicate separation or incomplete contact between the surface of the micro device and the surface of the transfer head due to either the presence of contamination particles or an otherwise damaged or deformed micro device. In both cases, a voltage may not be applied to the transfer head so as not to attempt to pick up the absent or damaged micro device. In the case where contamination is detected, a cleaning operation may be applied to the transfer head, micro device, or their respective array prior to reattempting the pick up operation.

In another embodiment, strain sensor 128A/128B is capable of measuring the resonant frequency of spring portion 122. A spring arm 124 bearing the weight of transfer head elements such as mesa structure 104, electrodes (not shown) and a dielectric layer (not shown), will have a natural resonant frequency. Upon picking up a micro device on the surface of the transfer head, the resonant frequency will change due to the additional weight of the micro device. In an embodiment, strain sensor 128A/128B can detect a change in the resonant frequency of spring portion 122, which indicates that a micro device has been successfully picked up by the transfer head.

In an embodiment, sensors 128A/B can be formed directly on or in base substrate 102. In an embodiment, sensors 128A/B can be formed on or in a spring layer 132 formed over substrate 102. For example, spring layer 132 is silicon, in which case a passivation layer (not shown) is formed between strain sensor 128A and the interface of spring anchor 120 and spring portion 122 in order to isolate the sensor. In another embodiment, spring layer 132 is an oxide or nitride layer. Referring to FIG. 6A, in an embodiment, strain sensor 128A is formed on spring layer 132 over the interface of spring anchor 120 and spring portion 122. When spring portion 122 deflects into space 112, strain along spring arm 124 is not uniform; spring arm 124 experiences the maximum amount of strain at the interface of spring portion 122 and spring anchor 120. In an embodiment, strain sensor 128A spans the interface of spring anchor 120 and spring portion 122, so as to be subject to the maximum amount of stress associated with the deflection of spring portion 122.

In an embodiment, strain sensor 128A comprises a piezoelectric material. A piezoelectric material accumulates charge in response to an applied mechanical stress. The accumulation of charge along strained surfaces of a piezoelectric sensor can generate a measurable voltage related to the amount of strain. As such, as spring portion 122 deflects into space 112, the voltage between the upper and lower surface of the strain sensor increases as the strain at the interface of spring anchor 120 and spring portion 122 increases, enabling calculation of the amount of deflection of spring portion 122. Piezoelectric materials include, for example, crystalline materials such as quartz and ceramic materials such as lead zirconate titanate (PZT).

In another embodiment, strain sensor 128A comprises a piezoresistive material. The electrical resistivity of a piezoresistive material changes in response to an applied mechanical stress. As such, strain sensor 128A may be subject to an electrical current, so that when spring portion 122 deflects into space 112, the electrical resistivity of strain sensor 128A increases as the strain at the interface of spring anchor 120 and spring portion 122 increases, causing a measurable increase in the voltage across the sensor. The amount of deflection can be calculated from the changes in voltage. Piezoresistive materials include, for example, polycrystalline silicon, amorphous silicon, monocrystalline silicon, or germanium.

In an embodiment, strain sensor 128B is formed within the surface of base substrate 102 at the interface of spring anchor 120 and spring portion 122, as shown in FIG. 6B. In an embodiment, spring anchor 120 and spring arm 124 of spring portion 122 are formed from silicon. In an embodiment, portion of the interface of spring anchor 120 and spring portion 122 is doped to form a piezoresistive strain sensor 128B. For example, the silicon surface may be doped with boron for a p-type material or arsenic for an n-type material. The changing mobility of charge carriers when the doped sensor region is strained gives rise to the piezoresistive effects.

In another aspect, strain sensor 128A, 128B is used to measure the resonant frequency of spring portion 122. In an embodiment, spring portion 122 oscillates at a resonant frequency determined in part by the weight of the elements forming spring portion 122. The oscillation results in a correspondingly oscillating amount of strain at the interface of spring anchor 120 and spring portion 122. After a micro device has been picked up by the transfer head, the additional weight of the micro device will change the resonant frequency of spring portion 122, resulting in changes in the oscillating strain at the interface of spring anchor 120 and spring portion 122 that can be measured by strain sensor 128. In this manner, strain sensor 128A, 128B may be used to determine if a transfer head has successfully picked up a micro device during a pickup operation.

Figure 6C:
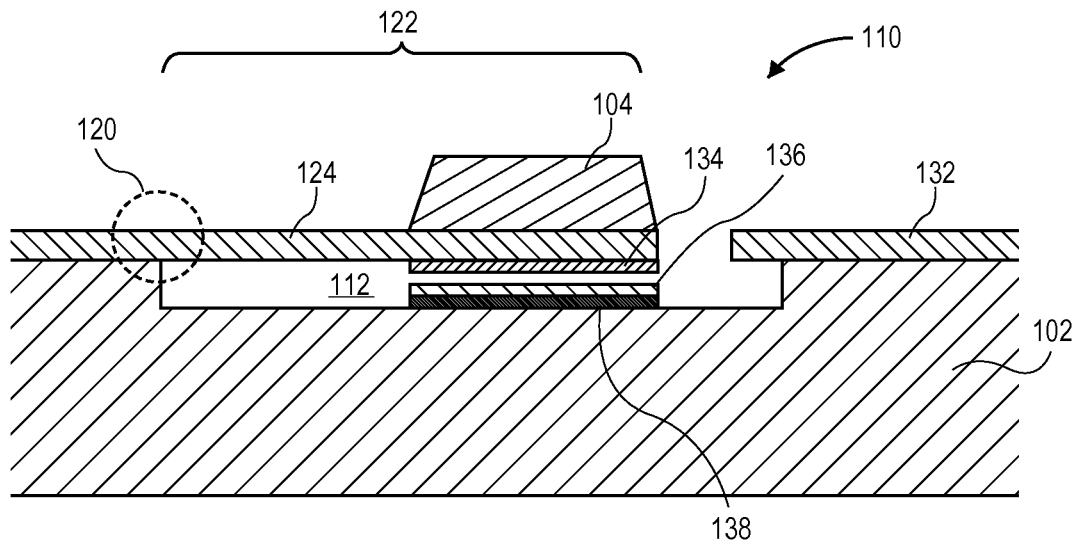

Referring to FIG. 6C, opposing electrodes are formed on each of spring portion 122 and bulk substrate 102, according to an embodiment of the invention. In an embodiment, the bottom surface of spring arm 124 facing space 112 comprises a backside electrode 134. In an embodiment, backside electrode 134 is positioned on the bottom surface of spring arm 124 opposite the mesa structure 104 formed on the top surface. In an embodiment, opposing electrode 138 is formed on base substrate 102, directly opposite backside electrode 134 within space 112. In an embodiment, dielectric layer 136 covers opposing electrode 138. In another embodiment, dielectric layer 136 covers backside electrode 134.

In an embodiment, electrodes 134 and 138 function as a capacitive sensor. The capacitance between two parallel conductors increases as the distance between the conductors decreases. In an embodiment, a voltage is applied across electrodes 134 and 138. As the spring portion 122 is depressed within space 112 toward base substrate 102, the distance between electrodes 134 and 138 decreases, causing the capacitance between them to increase. In this manner, the amount of deflection of spring portion 122 can be calculated from changes in the capacitance between electrodes 134 and 138 across dielectric layer 136 and space 112. Dielectric 136 prevents shorting between the electrodes when spring portion 122 is fully depressed within space 112. The opposing electrodes 134, 138 may be formed from any suitable conductive material, such as those discussed above with respect to electrodes 116.

In another application, electrodes 134 and 138 may be used to measure the resonant frequency of spring portion 122. As discussed above, in an embodiment, spring portion 122 oscillates at a resonant frequency determined in part by the weight of elements forming spring portion 122. The oscillation may result in a correspondingly oscillating capacitance between electrodes 134 and 138. After a micro device has been picked up by the transfer head, the additional weight of the micro device will change the resonant frequency of spring portion 122, resulting in changes in the oscillating capacitance as measured by electrodes 134 and 138. In this manner, electrodes 134 and 138 may be used to determine if a transfer head has successfully picked up a micro device during a pickup operation.

In yet another application of the structure illustrated in FIG. 6C, the electrodes 134 and 138, together with dielectric 136, are capable of locking spring portion 122 in a fully depressed position. In an embodiment, prior to the pickup operation, the array of transfer heads may be depressed to the point that backside electrode 134 contacts the surface of dielectric 136. A voltage may then be applied between opposing electrode 138 and backside electrode 134, across dielectric 136, locking spring portion 122 in the depressed position. In the depressed position, the transfer heads may be "deflected" so that the topography is reduced and the transfer heads are not in position for pickup. The voltage across the dielectric may then be selectively removed for select transfer heads, which allows the spring arm to be released and return to the undeflected, neutral position. This position may correspond to a "selected" position, which has a higher topography and "selected" transfer heads are in position for pick up of the micro device.

Figure 6D:
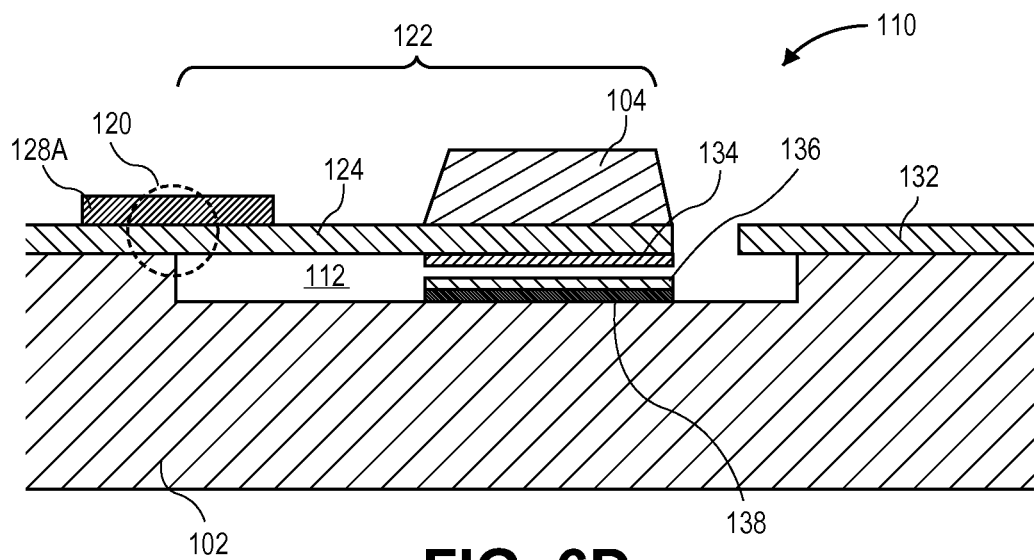

In an embodiment illustrated in FIG. 6D, transfer head 100 comprises both a strain sensor 128A and electrodes 134, 138. The strain sensor 128A and the electrodes 134, 138 may have different functions. For example, strain sensor 128A may measure deflection while electrodes 134, 138 measure the resonant frequency of spring portion 122, or vice versa. In another embodiment (not shown), a transfer head 100 comprises both a strain sensor 128B, formed within spring anchor 120 and spring portion 122, and electrodes 134, 138.

Figure 7:
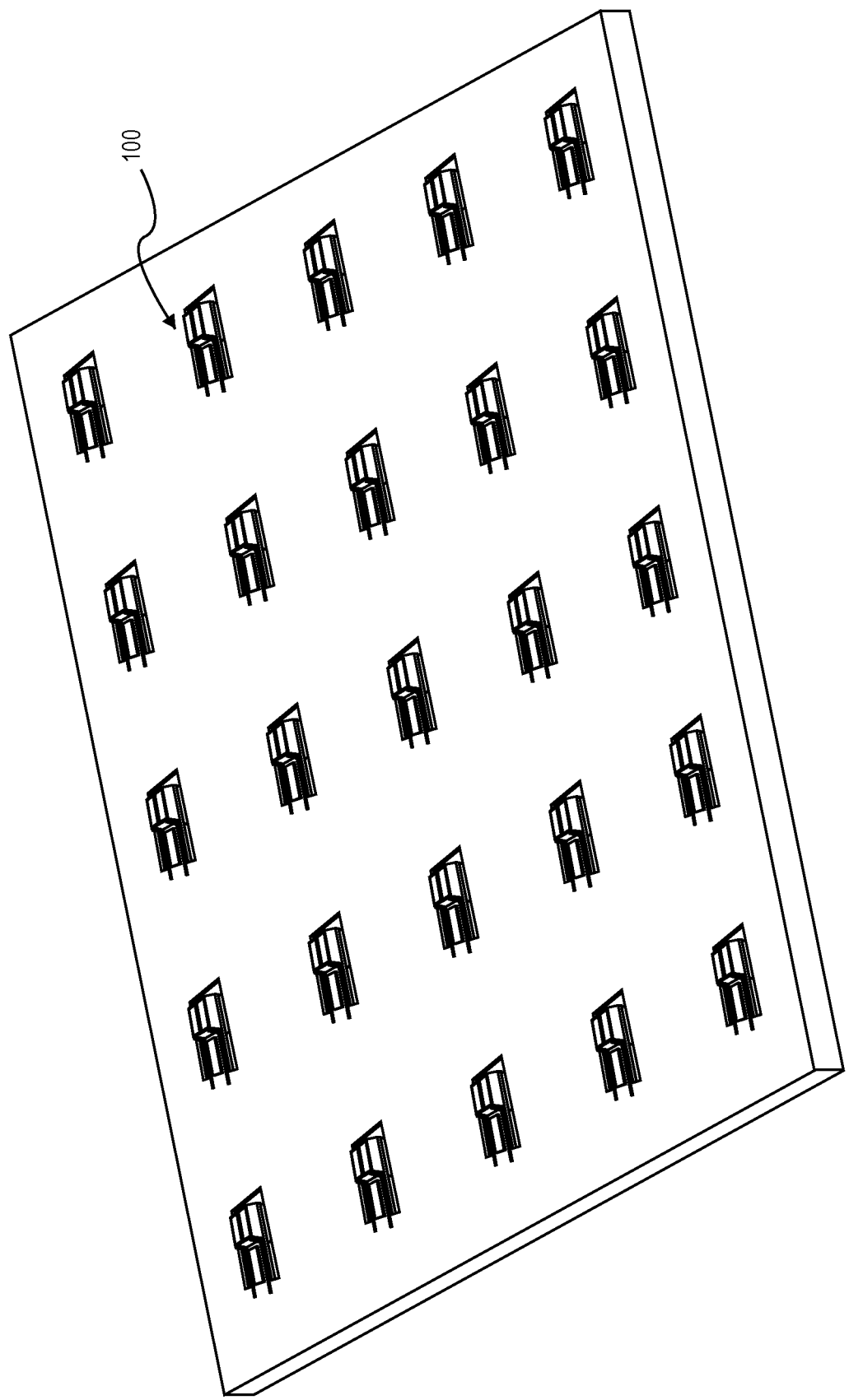
FIG. 7 is an isometric illustration of a bipolar cantilever micro device transfer head array in accordance with an embodiment of the invention.
Figure 8:
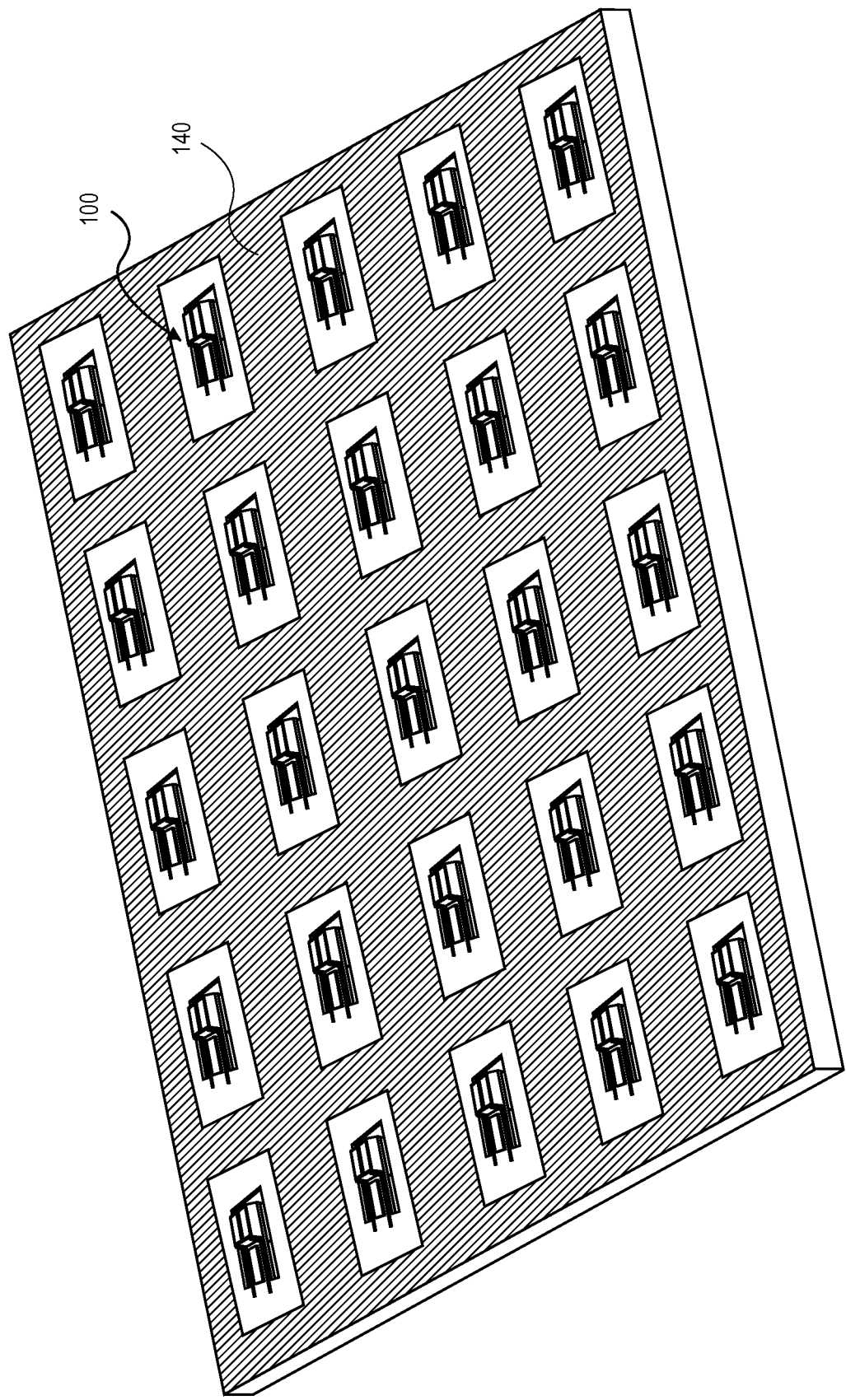
FIG. 8 is an isometric illustration of a bipolar cantilever micro device transfer head array including a conductive ground plane in accordance with an embodiment of the invention.
Figure 9:
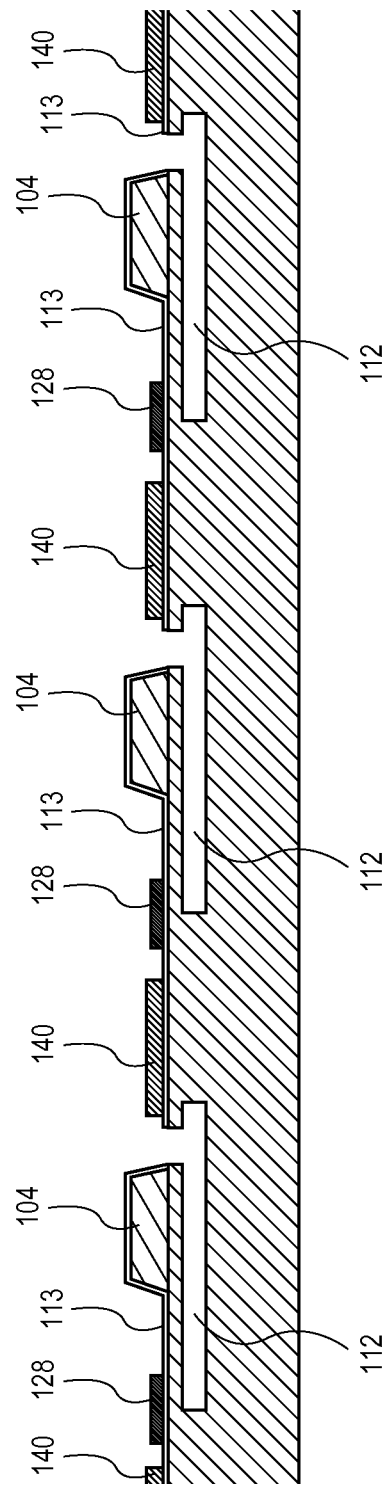
FIG. 9 is a cross-sectional side view illustration of a bipolar cantilever micro device transfer head array including a conductive ground plane in accordance with an embodiment of the invention.

Referring now to FIGS. 7-9, an embodiment of the invention is illustrated in which a conductive ground plane is formed over the dielectric layer and surrounding the array of transfer heads. FIG. 7 is an isometric view illustration of an array of compliant micro device transfer heads 100 with a bipolar electrode configuration as previously described with regard to FIG. 3. For purposes of clarity, the optional underlying passivation layer and overlying dielectric layer have not been illustrated. Referring now to FIGS. 8-9, a conductive ground plane 140 is formed over the dielectric layer 113 and surrounding the array of transfer heads 100. The presence of ground plane 140 may assist in the prevention of arcing between transfer heads 100, particularly during the application of high voltages. Ground plane 140 may be formed of a conductive material which may be the same as, or different as the conductive material used to form the electrodes, or vias. Ground plane 140 may also be formed of a conductive material having a lower melting temperature than the conductive material used to form the electrodes since it is not necessary to deposit a dielectric layer of comparable quality (e.g. dielectric strength) to dielectric layer 113 after the formation of ground plane 140.

Figure 10:
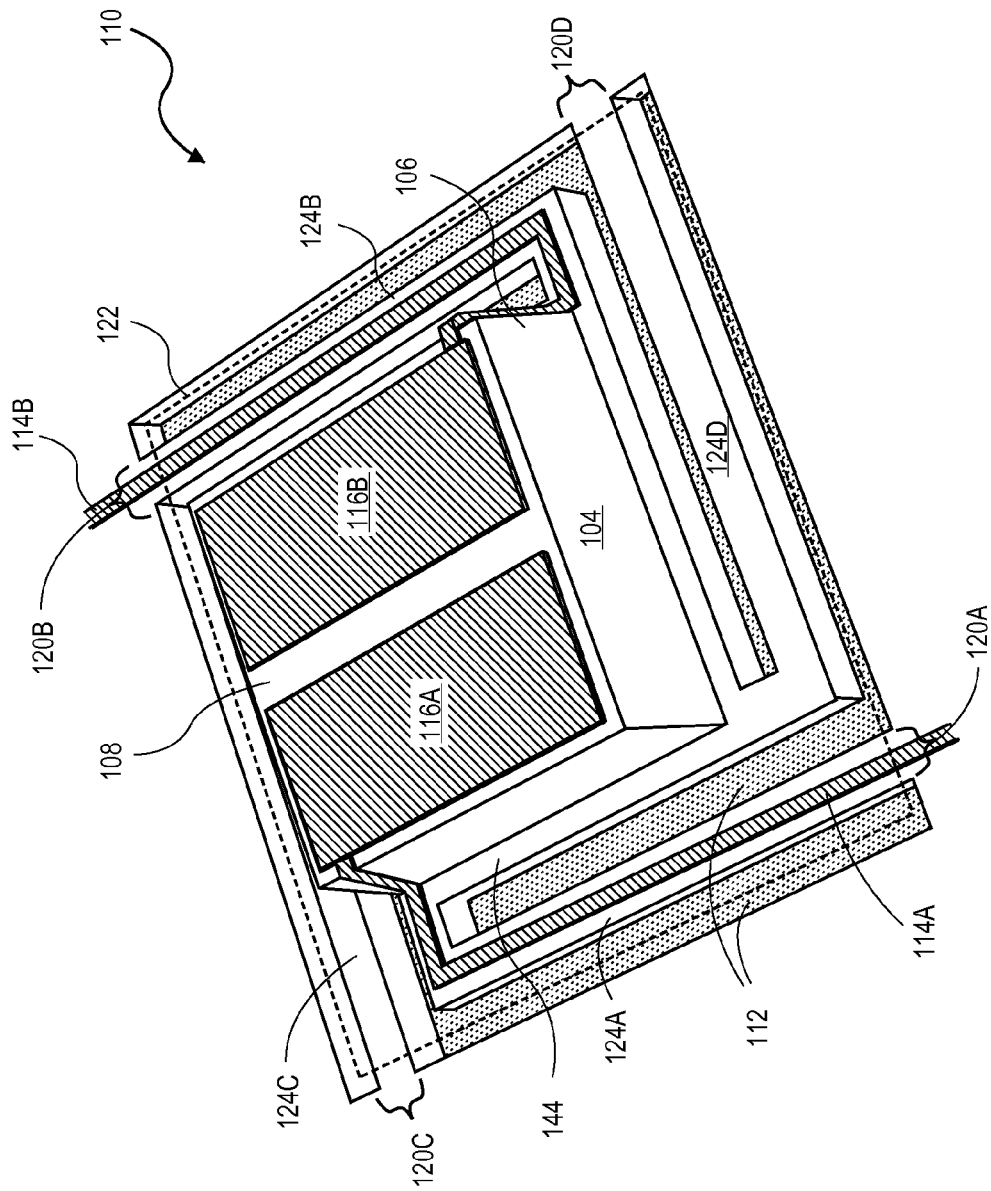
FIG. 10 is an isometric illustration of a bipolar micro device transfer head comprising multiple spring arms in accordance with an embodiment of the invention.

FIG. 10 is an isometric view of a spring member structure where the spring portion comprises multiple spring arms, according to an embodiment of the invention. In an embodiment, spring member 110 comprises spring portion 122 and multiple spring anchors 120A-D. In an embodiment, spring portion 122 comprises mesa structure 104 formed on spring platform 144, four spring arms 124A-D, two electrodes 116A-B forming a bipolar electrode, and two electrode leads 114A-B. Spring platform 144 provides a structural base for the formation of mesa structure 104 and additional elements of the transfer head (e.g., electrodes and dielectric layer).

In an embodiment, multiple spring arms 124A-D enable top surface 108 and the additional device components formed thereon to remain level when spring portion 122 is deflected into underlying space 112. A level top surface of the transfer head may improve contact with the top surface of a micro device during a pickup operation. In an embodiment, each spring arm 124 extends from a corner of spring platform 144 and runs parallel to the edge of spring platform 144 before attaching to the base substrate at a spring anchor 120. By running the length of one edge of spring platform 144, spring arms 124A-D have sufficient length to enable a desired degree of deflection of spring portion 122 into underlying space 112. In an embodiment, spring arms 124 have a thickness T less than their width W to ensure that the spring portion 122 deflects downward into underlying space 112 in response to pressure applied to top surface 108, while experiencing minimal torsional/lateral deformation. The specific dimensions of spring arms 124 depend on the modulus of the material from which they are formed. Spring arms 124 may be formed from any of the materials discussed above with respect to spring arm 124 in FIGS. 1-2.

Additionally, mesa structure 104 may have the characteristics discussed above with respect to a mesa structure formed on a cantilever structure spring portion. In an embodiment, mesa structure 104 is formed integrally with spring platform 144. In another embodiment, mesa structure 104 is formed over spring platform 144.

Still referring to the embodiment illustrated in FIG. 10, electrode leads 114A, 114B each run from a respective electrode 116A, 116B, down a tilted sidewall 106 of mesa structure 104 and along a respective spring arm 124A, 124B to spring anchors 120A, 120B. In an embodiment, electrode leads 114 connect the micro device transfer head to the working electronics of an electrostatic gripper assembly via interconnects in the base substrate. It is to be understood that other electrode and electrode lead configurations may be used in conjunction with a spring member having multiple spring arms, such as, a monopolar electrode (FIG. 2) and electrode lead vias (FIG. 4), as discussed above with respect to a spring member having a single-arm cantilever structure.

Figure 11:
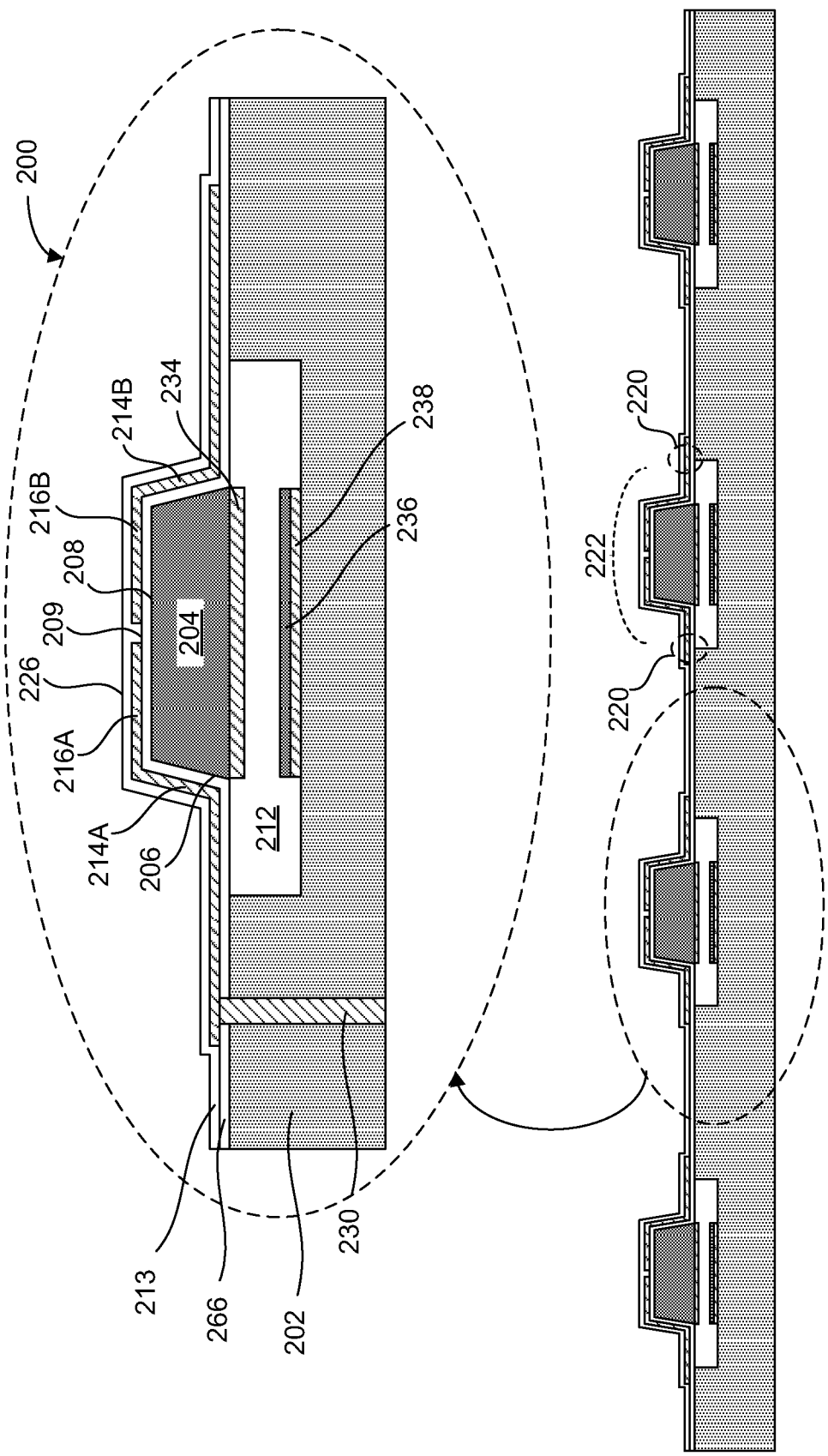
FIG. 11 is a cross-sectional side view illustration of a bipolar membrane micro device transfer head in accordance with an embodiment of the invention.

Referring now to FIG. 11, a side view illustration is provided of a compliant micro device transfer head 200 having a spring member with a membrane structure and a bipolar electrode, along with a corresponding transfer head array, according to an embodiment of the invention. As shown, the bipolar device transfer head 200 may include a base substrate 202, a spring member comprising spring anchor 220 coupled to base substrate 202 and a spring portion 222 comprising electrodes 216A/216B, and a dielectric layer 213 covering the top surface of electrodes 216A/216B. The spring portion 222 is deflectable into a space 212 between the spring portion 222 and the base substrate 202. In an embodiment of the invention, spring portion 222 additionally comprises spring layer 266, and mesa structure 204 having top surface 208 and tapered sidewalls 206.

Base substrate 202 may be formed from a variety of materials such as silicon, ceramics and polymers that are capable of providing structural support, as described above with respect to base substrate 102. Base substrate 202 may additionally include interconnect 230 to connect the micro device transfer head 200 to the working electronics of an electrostatic gripper assembly via electrode lead 214A or 214B.

Figure 12:
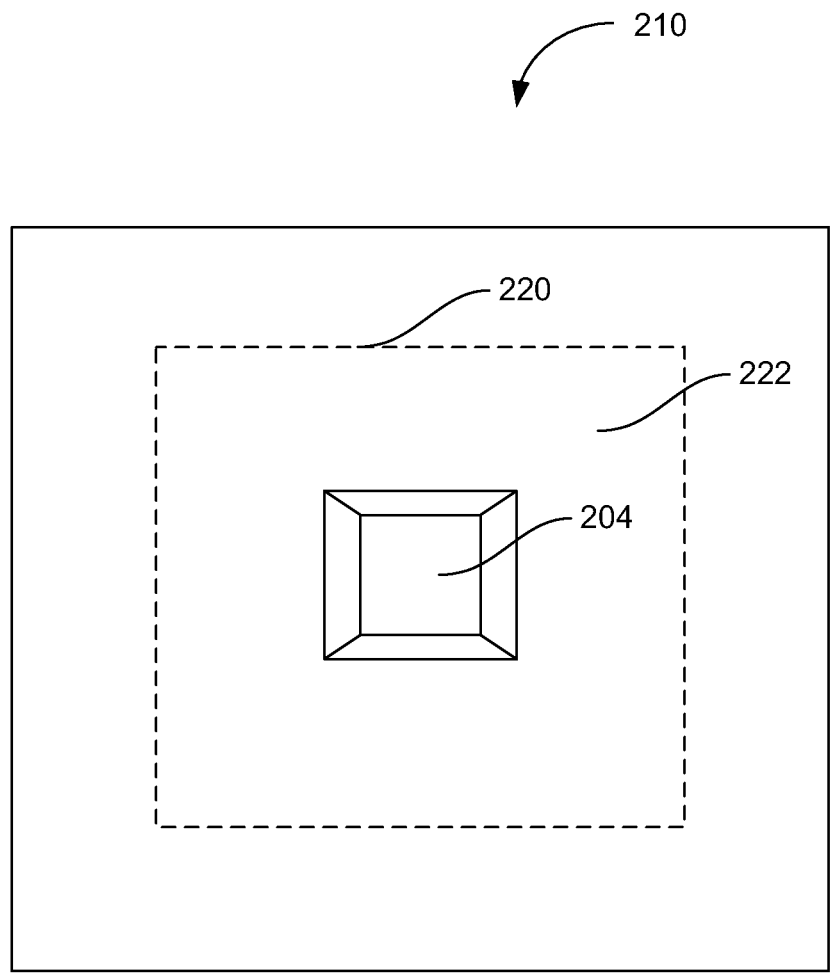
FIG. 12 is an overhead isometric illustration of a membrane micro device transfer head in accordance with an embodiment of the invention.

A top-down view of spring member 210 having a membrane structure is illustrated in FIG. 12, according to an embodiment of the invention. In an embodiment, the spring anchor 220 comprises the full perimeter of spring portion 222, at the interface of spring portion 222 and base substrate 202. In an embodiment, spring portion 222 comprises a mesa structure 204 that is centrally positioned with respect to spring anchor 220. Other elements of spring member 210 have been omitted from FIG. 12 for clarity.

Referring back to FIG. 11, spring portion 222 comprises spring layer 266, mesa structure 204, electrodes 216A, 216B, and electrode leads 214A, 214B. Spring layer 266 is formed from a material having an elastic modulus that enables deflection of spring portion 222 into space 212 over the working temperature range of the micro device transfer process. In an embodiment, spring layer 266 is formed from the same or different material as base substrate 202, for example, semiconductor materials such as silicon or dielectric materials such as silicon dioxide and silicon nitride. In an embodiment, spring layer 266 is integrally formed from base substrate 202, such as, during the etching of space 212. In another embodiment, spring layer 266 is formed from a layer of material bonded onto the surface of base substrate 202. An optional passivation layer (not shown) may be formed over spring layer 266 in order to isolate spring layer 266 from electrodes 216. In an embodiment, spring layer 266 is from 0.5 μm to 2 μm thick.

In an embodiment, electrodes 216A, 216B are formed over spring layer 266 and over the top surface 208 of mesa structure 204. Electrode leads 214A, 214B may run from electrodes 216A, 216B along the top surface 209 of spring layer 266, and over spring anchor 220. In an embodiment, electrode leads 214A, 214B connect to interconnect 230 in base substrate 202. The materials and dimensions of electrodes 216A, 216B and electrode leads 214A, 214B may be the same as described above with respect to electrodes 116 and electrode leads 114.

Dielectric layer 213 is formed over the surface. In an embodiment, the dielectric layer 213 has a suitable thickness and dielectric constant for achieving the required grip pressure of the micro device transfer head, and sufficient dielectric strength to not break down at the operating voltage. The dielectric layer 213 may be a single layer or multiple layers, and may be the same or different material as the optional passivation layer. Suitable dielectric materials may include, but are not limited to, aluminum oxide ($Al_2O_3$) and tantalum oxide ($Ta_2O_5$), as described above with respect to dielectric layer 113. In an embodiment, dielectric layer 213 is from 0.5 to 2 μm thick. In an embodiment, top surface 226 of dielectric layer 213 over the mesa structure 204 corresponds to the top surface of the compliant micro device transfer head 200.

In an embodiment space 212 is a cavity in the surface of base substrate 202. In an embodiment, spring portion 222 completely covers space 212. Spring portion 222 is deflectable into space 212. The depth of space 212 is determined by the amount of deflection desired for spring portion 222, while the width of space 212 is determined by the pitch of the transfer head array, as discussed above with respect to space 112. The width of space 212 is less than the pitch of the transfer heads, but greater than the top surface 226 of each transfer head 200.

In an embodiment, transfer head 200 further comprises backside electrode 234 and opposing electrode 238. In an embodiment, backside electrode 234 is formed on the lower surface of spring portion 222, underneath mesa structure 204. In an embodiment, opposing electrode 238 is formed within space 212 opposite backside electrode 234. In an embodiment, dielectric layer 236 covers opposing electrode 238. In another embodiment, dielectric layer covers backside electrode 234. Electrodes 234 and 238 may be operated so as to sense deflection of spring portion 222, to monitor the resonant frequency of spring portion 222, and/or to lock spring portion 222 in the deflected position, as described above with respect to backside electrode 134, opposing electrode 138, and dielectric 136 in FIG. 6C.

Figure 13A:
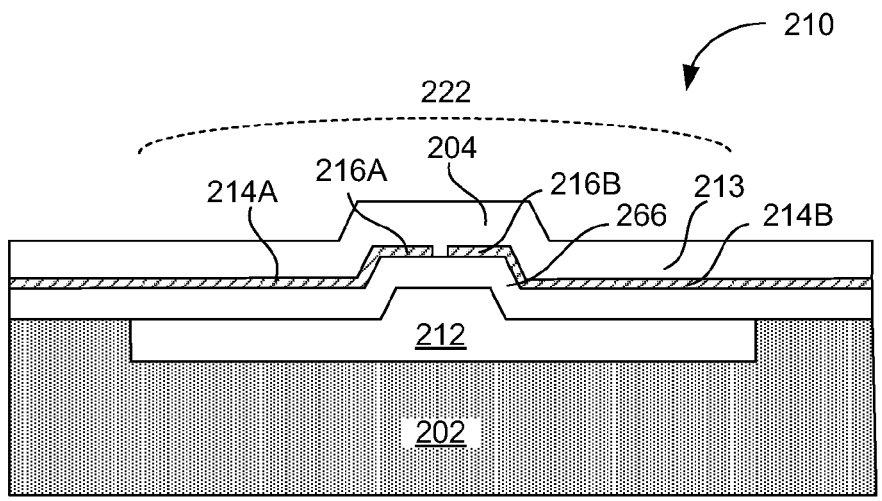
FIGS. 13A-E are cross-sectional side view illustrations of bipolar membrane micro device transfer heads according to an embodiment of the invention.
Figure 13B:
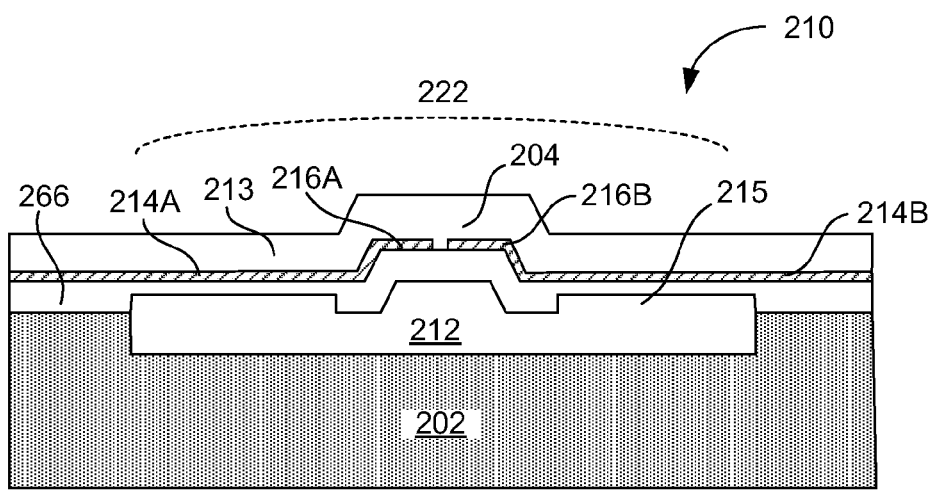
Figure 13C:
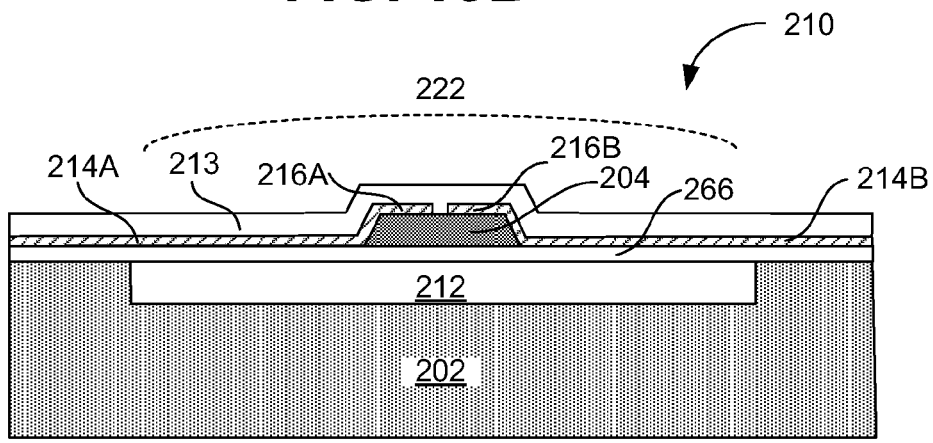

FIGS. 13A-E illustrate cross-sectional views of additional embodiments of spring members having a membrane structure. In FIG. 13A, the layers of material forming spring portion 222 of spring member 210 are shaped to form a mesa structure 204, according to an embodiment of the invention. In FIG. 13B, spring portion 222 further comprises grooves 215, according to an embodiment of the invention. Grooves 215 may reduce the pressure required to deflect spring portion 222 into space 212. In FIG. 13C, mesa structure 204 is formed over spring layer 266, according to an embodiment of the invention. In an embodiment, electrodes 216A, 216B are formed over mesa structure 204, and dielectric layer 213 covers electrodes 216A, 216B.

Figure 13D:
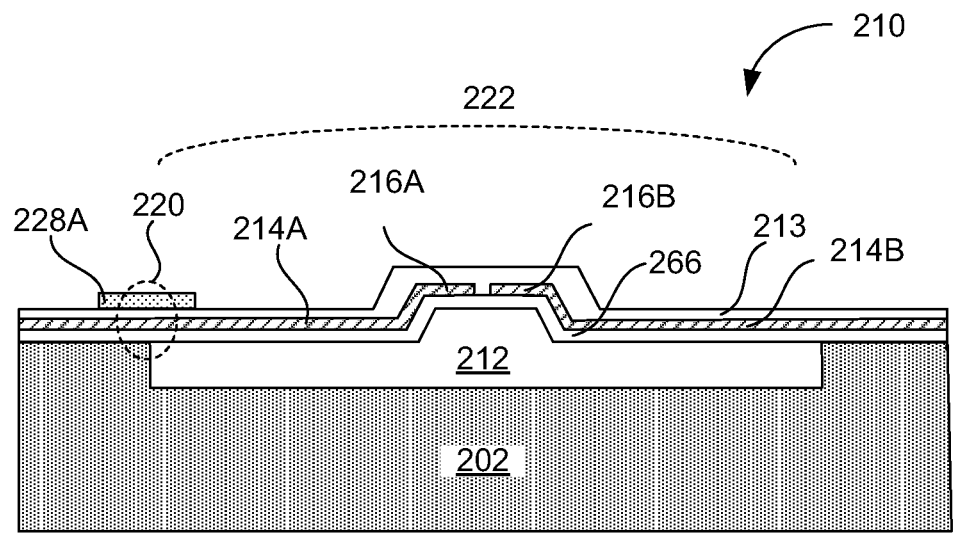

In FIG. 13D, the compliant transfer head comprises strain sensor 228A. In an embodiment, strain sensor 228A is formed on dielectric layer 213, over the interface of spring anchor 220 and spring portion 222. When the spring portion 222 deflects into space 212 during a pick up operation, spring portion 222 and dielectric layer 213 deflect, straining strain sensor 228A. As such, the degree of deflection of membrane spring member 210 during a pick up operation can be measured. In addition, strain sensor 228A can be used to detect changes in the resonant frequency of spring portion 222 that indicate a micro device has been picked up by the transfer head. Strain sensor 228A may be formed from a piezoelectric or piezoresistive material, as described above with respect to strain sensor 128A in FIG. 6A.

Figure 13E:
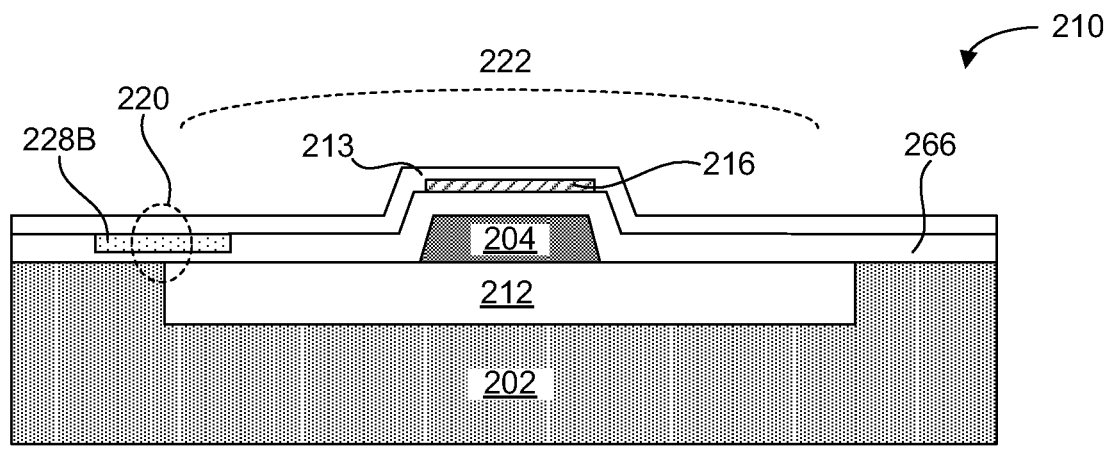

In FIG. 13E, the compliant transfer head comprises strain sensor 228B. In an embodiment, strain sensor 228B is formed within a silicon spring layer 266, spanning the interface of spring anchor 220 and spring portion 222. When spring portion 222 deflects into space 212 during a pick up operation, the spring layer 266 portion of spring portion 222 deflects, straining strain sensor 228B. As such, the degree of deflection of spring member 210 during a pick up operation can be measured. In addition, as discussed above with respect strain sensors 128A, 128B, and 228A, strain sensor 228B can be used to detect changes in the resonant frequency of spring portion 222 that indicate a micro device has been picked up by the transfer head. In an embodiment, strain sensor 228B is formed from a piezoresistive material, as described above with respect to strain sensor 128B in FIG. 6B. In an embodiment where spring layer 266 is silicon, strain sensor 228B may be formed by doping a portion of spring layer 266.

Figure 14A:
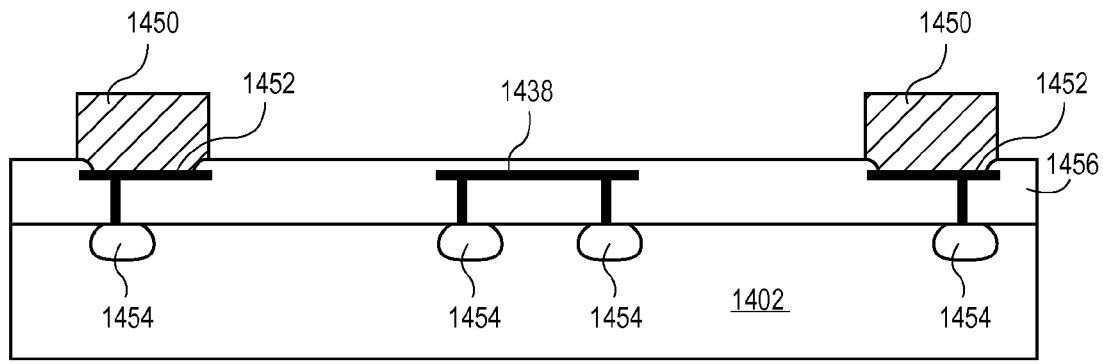
FIGS. 14A-E are cross-sectional side view illustrations of a method for forming a bipolar membrane micro device transfer head according to an embodiment of the invention.

FIGS. 14A-E illustrate a method for forming a micro device transfer head, according to an embodiment of the invention. In an embodiment, a base substrate 1402 having active zones 1454 is provided, as shown in FIG. 14A. A dielectric layer 1456 comprising interconnects 1452 and buried electrode 1438 is formed over base substrate 1402. Interconnects 1452 and electrode 1438 each connect to active zones 1454 in base substrate 1402. A metal bump 1450 is formed over each interconnect 1452. In an embodiment, base substrate 1402 has the characteristics discussed above with respect to base substrate 202. In an embodiment, base substrate 1402 is silicon. Active zones 1454 may be n-type or p-type doped. Interconnects 1452 and buried electrode 1438 may be any suitable conductive material, such as Al or Cu. Metal bumps 1450 may be any suitable conductive material, such as Cu or Au. In an embodiment, metal bumps 1450 are 2 µm thick.

Figure 14B:
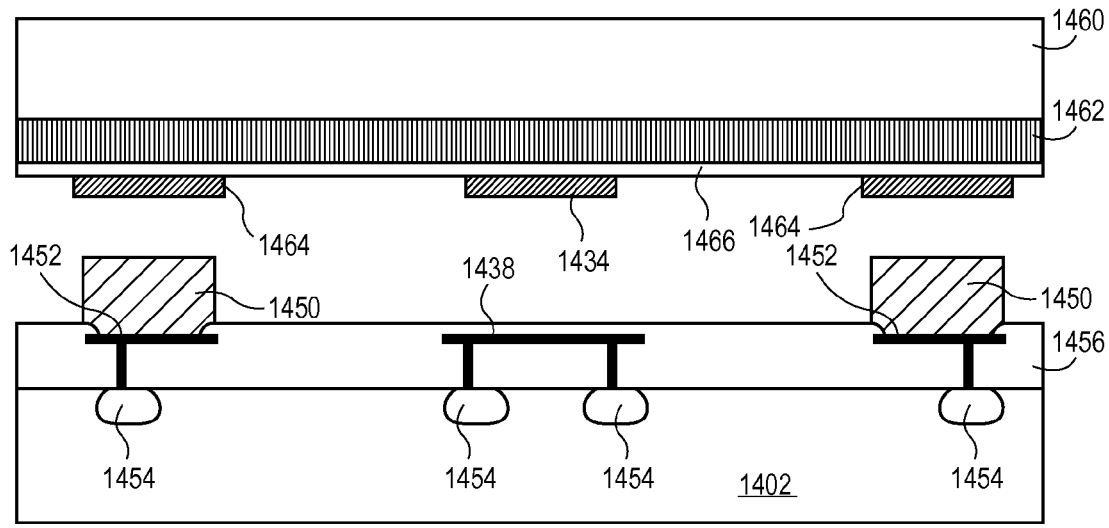

Next, a handle substrate 1460 having an oxide layer 1462 and a spring layer 1466 is provided, as shown in FIG. 14B. An SOI substrate may be used, wherein handle substrate 1460 is a silicon wafer, oxide layer 1462 is silicon oxide, and spring layer 1466 is silicon. In an embodiment, oxide layer 1462 is approximately 2 µm thick. In an embodiment, spring layer 1466 is 0.5 µm to 1 µm thick. In an embodiment, the spring layer 1466 is coupled to metal bumps 1450 via metal pads 1464. In an embodiment, metal pads 1464 are Au and up to 1 µm thick. In an embodiment, backside electrode 1434 is formed on the surface of spring layer 1466 between metal pads 1464. Backside electrode 1434 may be any suitable conductive material, as discussed above with respect to backside electrode 234 in FIG. 11.

Spring layer 1466 is bound to metal bumps 1450 via metal pads 1464, creating space 1412 between the surfaces of spring layer 1466 and dielectric layer 1456, according to an embodiment. In an embodiment, the subsequently formed spring portion comprising spring layer 1466 will be deflectable into space 1412. In an embodiment, space 1412 is approximately 2 µm thick, corresponding to the 2 µm thickness of metal bumps 1450. In an embodiment, backside electrode 1434 is aligned over buried electrode 1438.

Figure 14C:
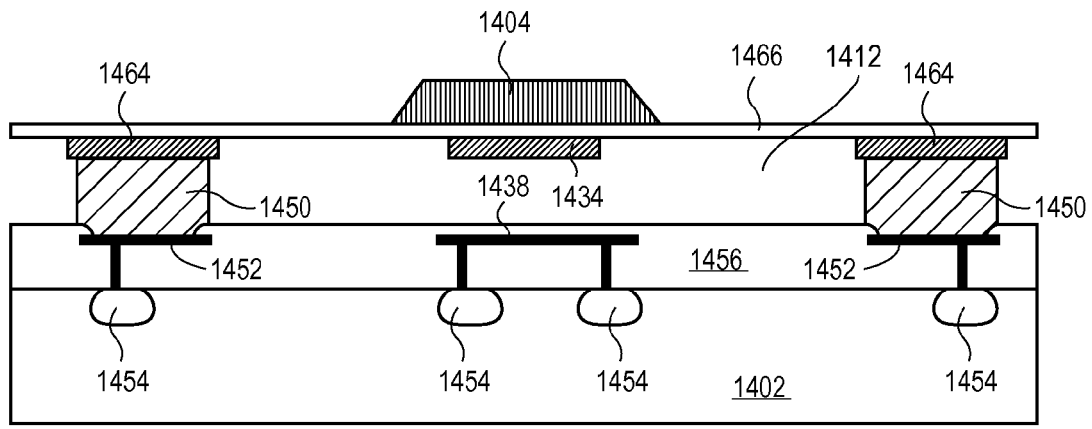
Figure 14D:
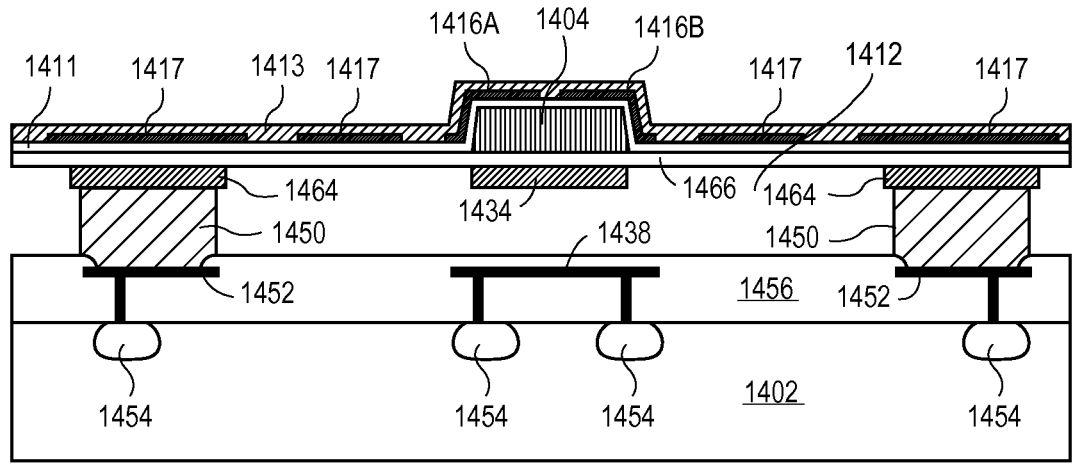

In an embodiment, handle substrate 1460 is then removed. Handle substrate 1460 may be removed by any appropriate method, such as chemical-mechanical polishing (CMP) or wet etch. In an embodiment, oxide layer 1462 is patterned to form mesa structure 1404 on the surface of spring layer 1466, as shown in FIG. 14C. Oxide layer 1462 may be patterned by any appropriate method known in the art. In an embodiment, oxide layer 1462 is completely removed from the surfaces of spring layer 1466 that are adjacent to mesa structure 1404. A passivation layer 1411 may then be formed over the top surface of spring layer 1466 and mesa structure 1404, as shown in FIG. 14D. Passivation layer 1411 electrically isolates metal electrodes 1416 from spring layer 1466 to prevent shorting. In an embodiment, passivation layer 1411 is 500 Å thick. Passivation layer 1411 may be any suitable insulating dielectric material, such as $Al_2O_3$ or $Ta_2O_5$. In another embodiment, oxide layer 1462 is etched to leave a thin portion of oxide material covering the surface of spring layer 1466 between mesa structures 1404. In such a case, passivation layer 1411 may be omitted.

A layer of metal is then blanket deposited over the surface of passivation layer 1411 and patterned to form electrodes 1416A, 1416B and signal lines 1417. Electrodes 1416 and signal lines 1417 may be formed from a conductive material such as those discussed above with respect to electrodes 116A, 116B.

Dielectric layer 1413 is then blanket deposited over the surface, as shown in FIG. 14D. In an embodiment, the dielectric layer 1413 has a suitable thickness and dielectric constant for achieving the required grip pressure of the micro device transfer head, and sufficient dielectric strength to not break down at the operating voltage. The dielectric layer 1413 may be a single layer or multiple layers, and may be the same or different material as passivation layer 1411. Suitable dielectric materials may include, but are not limited to, aluminum oxide ($Al_2O_3$) and tantalum oxide ($Ta_2O_5$), as described above with respect to dielectric layer 113, 213. Dielectric layer 1413 is from 0.5 µm to 2 µm thick. In an embodiment, dielectric layer 1413 is a 0.5 µm thick layer of $Al_2O_3$. In an embodiment, dielectric layer 1413 is deposited by atomic layer deposition (ALD).

FIG. 14D illustrates an embodiment of a micro device transfer head having a spring member with a membrane structure. The structure in FIG. 14D may be further processed to form a transfer head having other spring member structures. For example, a portion of spring layer 1466, passivation layer 1411, and dielectric layer 1413 are patterned to define a spring member with a multi spring-arm structure, as illustrated in cross-section by FIG. 14E. Spring layer 1466, passivation layer 1411, and dielectric layer 1413 may also be patterned to form a cantilever structure, such as that described above with respect to FIGS. 1-2.

Figure 14E:
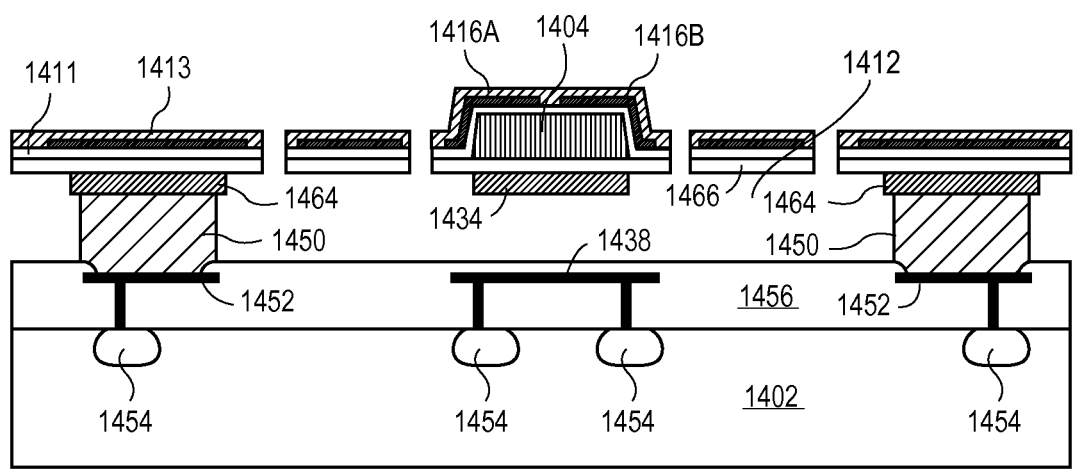

In the embodiments shown in each of FIGS. 14D and 14E, backside electrode 1434 and buried electrode 1438 form a capacitive sensor as described above with respect to backside electrode 134 and opposing electrode 138 in FIG. 6C, and backside electrode 234 and opposing electrode 238 in FIG. 11. In another embodiment, backside electrode 1434 and buried electrode 1438 enable the locking of the spring portion in the deflected position, as described above with respect to backside electrode 134 and opposing electrode 138 in FIG. 6C, and backside electrode 234 and opposing electrode 238 in FIG. 11.

Figure 15A:
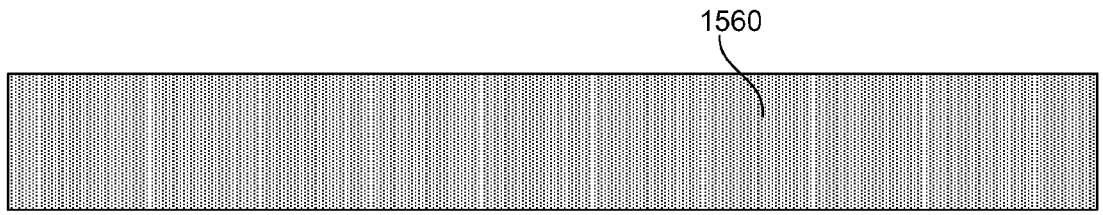
FIGS. 15A-K are cross-sectional side view illustrations of a method for forming a bipolar membrane micro device transfer head according to an embodiment of the invention.

FIGS. 15A-K illustrate a cross sectional view of a method for forming a micro device transfer head having spring member with a membrane structure, according to an embodiment of the invention. Handle substrate 1560 is provided, as shown in FIG. 15A. Handle substrate 1560 may be formed from a variety of materials such as silicon, ceramics and polymers that are capable of providing structural support for subsequent formation of device layers. In an embodiment, handle substrate 1560 is a silicon wafer.

Figure 15B:
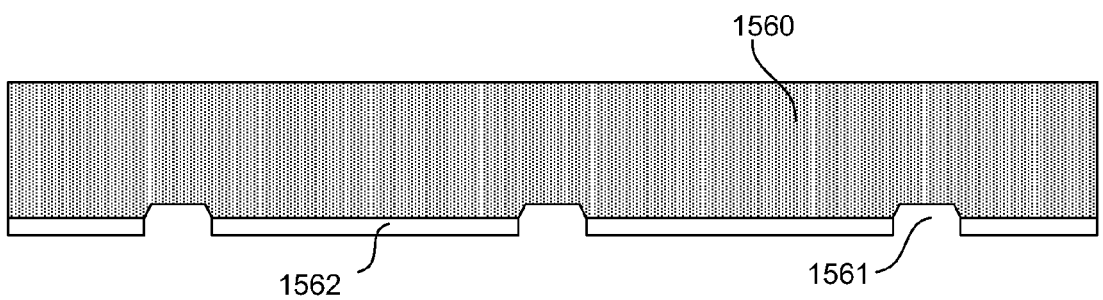
Figure 15C:
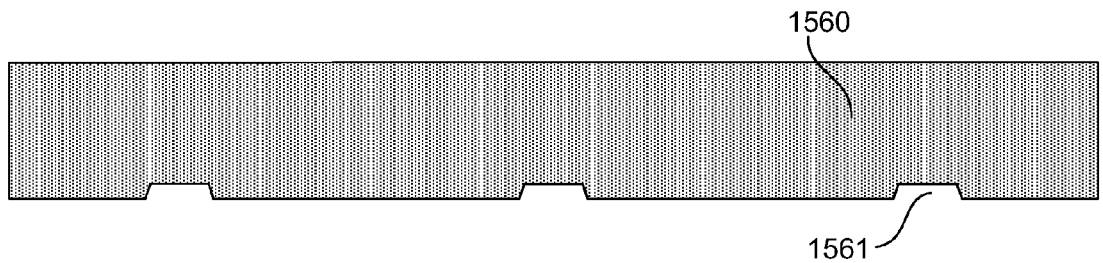

Next, mesa cavities 1561 are patterned in the surface of handle substrate 1560, according to an embodiment of the invention shown in FIG. 15B. Mesa cavities may be formed by any suitable process, such as photolithography and etching. In an embodiment, patterning layer 1562 is formed over one surface of handle substrate 1560 for the patterning of mesa cavities 1561. In an embodiment, patterning layer 1562 is photoresist. In another embodiment, patterning layer 1562 is a hardmask material, such as silicon oxide or silicon nitride. In an embodiment, mesa cavities 1561 are spaced at intervals corresponding to the pitch of the micro device transfer head array, for example 5 µm to 10 µm corresponding to an integer multiple of the array of micro devices to be picked up. The dimensions of each mesa cavity 1561 are determined by the desired dimensions of the top surface of the transfer head after the addition of additional device components, such as the electrodes and the dielectric layer, as described above with respect to FIGS. 1-2 and 11. In an embodiment, mesa cavities 1561 are 7 µm×7 µm wide and 2 µm deep. After the etching of mesa cavities 1561, patterning layer 1562 may removed as shown in FIG. 15C.

Figure 15D:
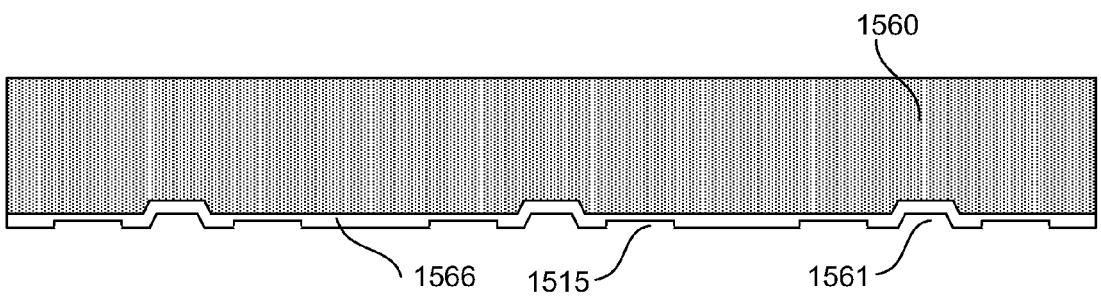

A spring layer 1566 is then formed over the surface of patterned handle substrate 1560, according to an embodiment of the invention shown in FIG. 15D. Spring layer 1566 may be any material suitable to form the structural basis of a membrane spring member in a micro device transfer head. The material and dimensions of spring layer 1566 are selected to enable the spring portion of the subsequently formed transfer head to deflect a desired amount under the operating conditions of the transfer process, as discussed above with respect to spring layer 266. Spring layer 1566 may be an oxide or nitride layer. In an embodiment, spring layer 1566 is a grown thermal oxide on the surface of silicon handle substrate 1560. In another embodiment, spring layer 1566 is formed by plasma enhanced chemical vapor deposition (PECVD). In an embodiment, spring layer 1566 is 0.5 µm to 3 µm thick.

In an embodiment, grooves 1515 are etched into the surface of spring layer 1566. Grooves 1515 may reduce the pressure required to deflect the transfer head spring portion that is subsequently formed comprising spring layer 1566. In another embodiment, after the formation of spring layer 1566, the remaining volume of each mesa cavity 1561 is filled with material, such as oxide or nitride (not shown), to be planar with the lower surfaces of spring layer 1566.

Figure 15E:
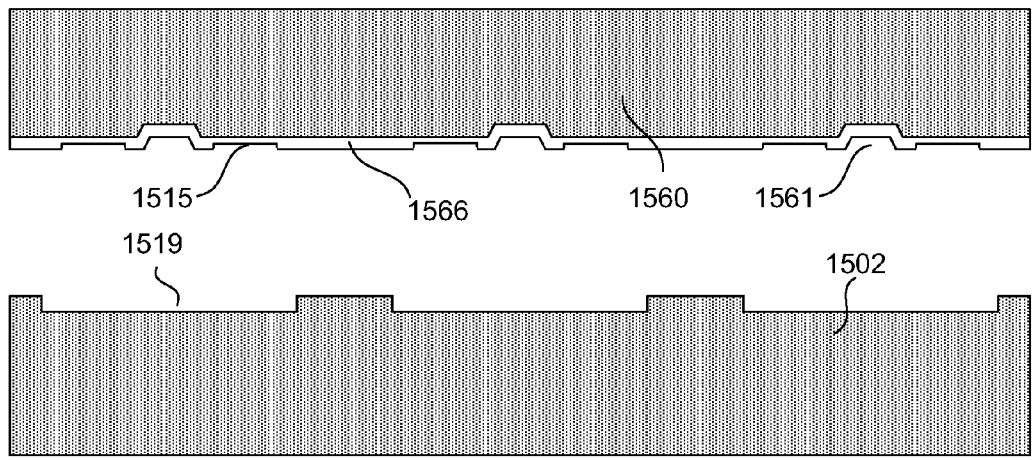

A base substrate 1502 having pits 1519 is then provided, as shown in FIG. 15E. Base substrate 1502 may be any of the materials described above with respect to base substrate 202. In an embodiment, pits 1519 are each at least 20 µm wide and 2 µm deep. In an embodiment, the pitch of pits 1519 matches the pitch of mesa cavities 1561.

Figure 15F:
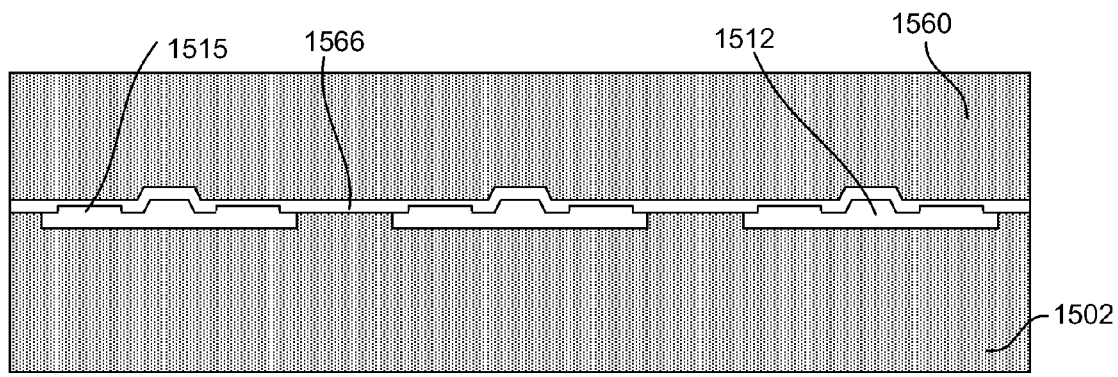
Figure 15G:
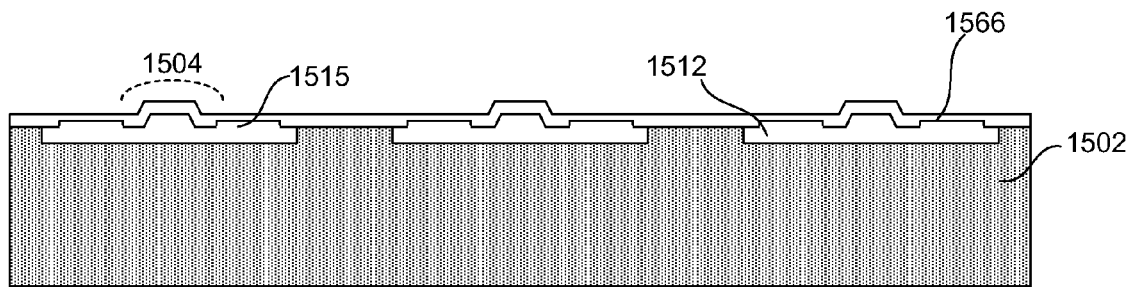

Handle substrate 1560 having spring layer 1566 thereon is then coupled to base substrate 1502, as shown in FIG. 15F. Spring layer 1566 and base substrate 1502 may be coupled by any suitable process, such as wafer bonding. In an embodiment, the mesa cavities 1561 in spring layer 1566 align with pits 1519 to enclose spaces 1512. Handle substrate 1560 is then removed, leaving spring layer 1566 bonded to the surface of base substrate 1502 as shown in FIG. 15G. Handle substrate 1560 may be removed by any suitable process or processes, such as CMP and wet etch. The removal of handle substrate 1560 leaves a membrane of spring layer 1566 having a mesa structure 1504 covering each space 1512.

Figure 15H:
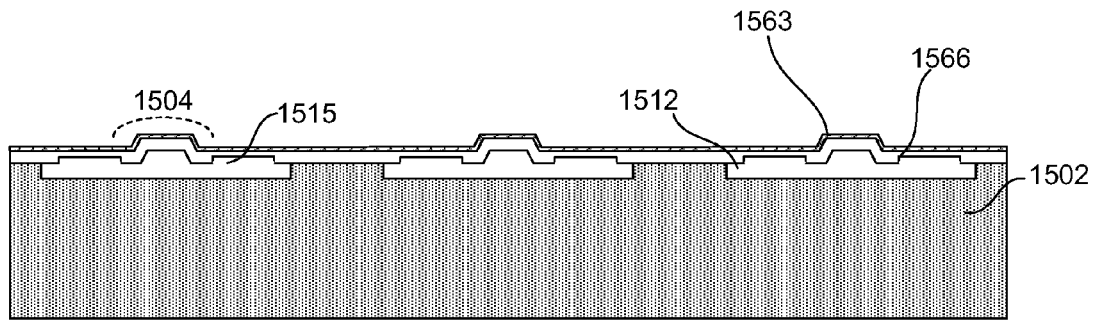

Metal layer 1563 is then formed over the surface of spring layer 1566, as shown in FIG. 15H. Metal layer 1563 may be formed from any suitable metal or layer of metals that adheres well to the underlying spring layer 1566, as discussed above with respect to materials for electrodes 116, 216. In an embodiment, metal layer 1563 is formed by sputter deposition. Metal layer 1563 is up to 0.5 µm thick. In an embodiment, metal layer 1563 is a 500 Å thick layer of TiW.

Figure 15I:
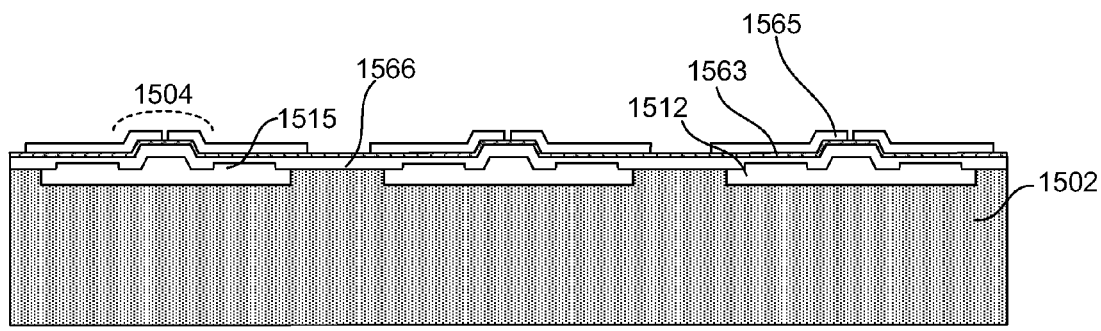
Figure 15J:
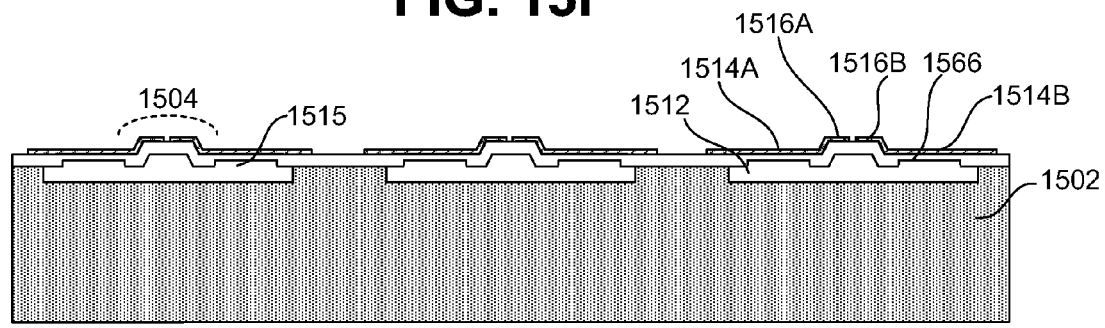
Figure 15K:
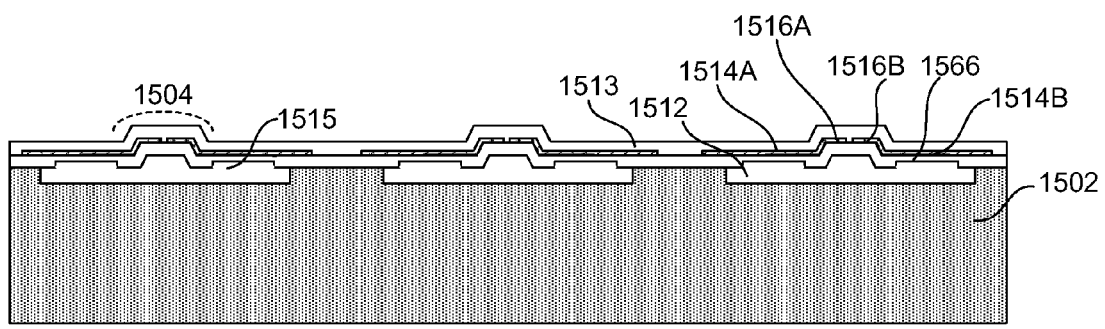

Metal layer 1563 is then patterned to form electrodes, according to an embodiment of the invention. Metal layer 1563 may be patterned by forming mask 1565 on the surface of metal layer 1563, as shown in FIG. 15I. Metal layer 1563 is then etched to form electrodes 1516A, 1516B and electrode leads 1514A, 1514B, as shown in FIG. 15J.

Next, dielectric layer 1513 is formed over spring layer 1566 and electrodes 1516. Dielectric layer 1513 has the properties described above with respect to dielectric layer 113, 213. In an embodiment, dielectric layer 1513 is a 0.5 µm thick layer of Al2O3. In an embodiment, dielectric layer 1513 is deposited by atomic layer deposition (ALD).

Figure 16A:
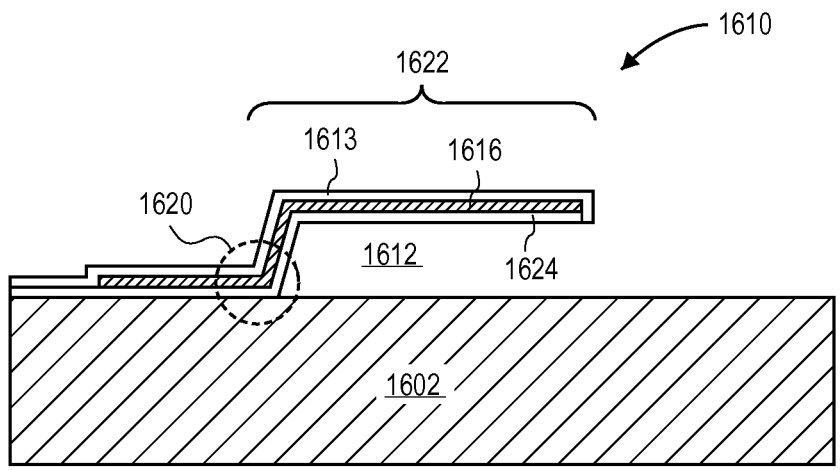
FIGS. 16A-D are cross-sectional side view illustrations of an elevated micro device transfer heads in accordance with an embodiment of the invention.

FIGS. 16A-D illustrate cross-sectional views of micro device transfer head structures wherein the spring portion is elevated above the surface of the base substrate. In an embodiment, spring portion 1622 comprises spring layer 1624 to create a spring member 1610 with a cantilever structure. Spring layer 1624 is elevated above the top surface of base substrate 1602 to create space 1612, as shown in FIG. 16A. Spring portion 1622 is deflectable into space 1612. Spring portion 1622 further comprises one or more electrodes 1616. Dielectric layer 1613 covers spring member 1610.

Figure 16B:
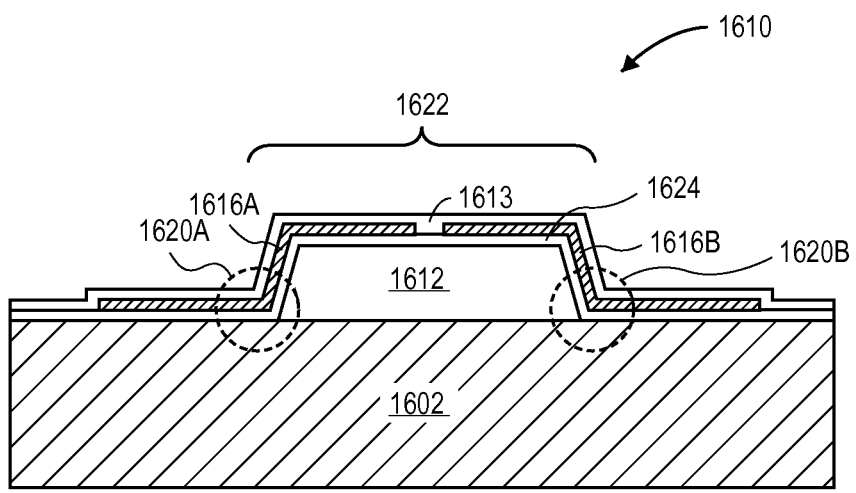

In another embodiment, spring portion 1622 is elevated above the top surface of base substrate 1602 by spring anchors 1620A and 1620B, as shown in FIG. 16B. Spring portion 1622 additionally comprises electrodes 1616A and 1616B. Dielectric layer 1613 is formed over the top surface of spring member 1610. Space 1612 is formed between spring portion 1622 and base substrate 1602. Spring portion 1622 is deflectable into space 1612.

Figure 16C:
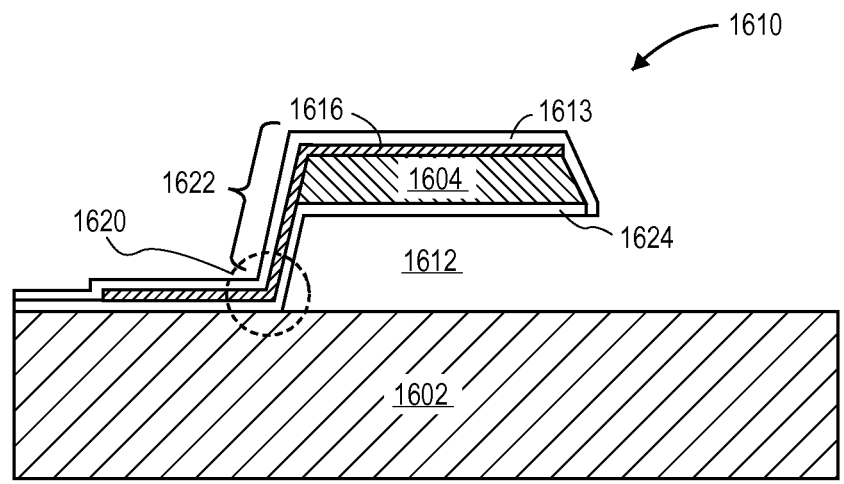
Figure 16D:
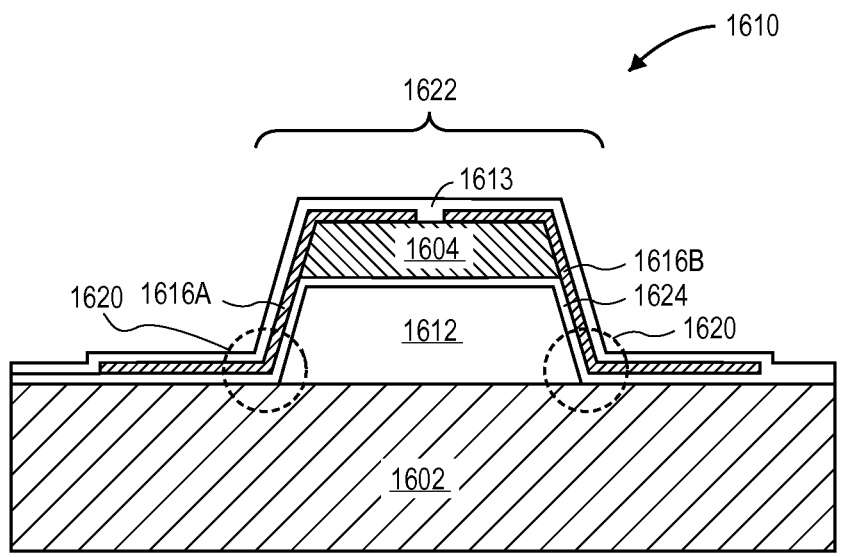

In another embodiment, spring portion 1622 further comprises mesa structure 1604 on spring layer 1624. An embodiment of a spring member 1610 with a cantilever structure, wherein the spring portion comprises a mesa structure 1604 is shown in FIG. 16C. An embodiment of a spring member 1610 with a table structure, wherein the spring portion comprises a mesa structure 1604 is shown in FIG. 16D.

FIG. 17 is a flow chart illustrating a method of picking up and transferring a micro device from a carrier substrate to a receiving substrate in accordance with an embodiment of the invention. At operation 1710 a compliant transfer head is positioned over a micro device connected to a carrier substrate. The compliant transfer head may comprise a base substrate, a spring member including a spring anchor coupled to the base substrate and a spring portion comprising an electrode where the spring portion is deflectable into a space between the spring portion and the base substrate, and a dielectric layer covering the top surface of the electrode as described in the above embodiments. The transfer head may have a monopolar or bipolar electrode configuration and a cantilever or membrane spring member structure, as well as any other structural variations as described in the above embodiments. The micro device is contacted with the compliant transfer head at operation 1720. In an embodiment, the micro device is contacted with the dielectric layer of the transfer head. In an alternative embodiment, the transfer head is positioned over the micro device with a suitable air gap separating them which does not significantly affect the grip pressure, for example, 1 nm (0.001 µm) or 10 nm (0.01 µm). At operation 1730 a voltage is applied to the electrode to create a grip pressure on the micro device, and the micro device is picked up with the transfer head at operation 1740. The micro device is then released onto a receiving substrate at operation 1750.

While operations 1710-1750 have been illustrated sequentially in FIG. 17, it is to be appreciated that embodiments are not so limited and that additional operations may be performed and certain operations may be performed in a different sequence. For example, in one embodiment, after contacting the micro device with the transfer head, the transfer head is rubbed across a top surface of the micro device in order to dislodge any particles which may be present on the contacting surface of either of the transfer head or micro device. In another embodiment, an operation is performed to create a phase change in the bonding layer connecting the micro device to the carrier substrate prior to or while picking up the micro device. If a portion of the bonding layer is picked up with the micro device, additional operations can be performed to control the phase of the portion of the bonding layer during subsequent processing.

Operation 1730 of applying the voltage to the electrode to create a grip pressure on the micro device can be performed in various orders. For example, the voltage can be applied prior to contacting the micro device with the transfer head, while contacting the micro device with the transfer head, or after contacting the micro device with the transfer head. The voltage may also be applied prior to, while, or after creating the phase change in the bonding layer.

Figure 27:
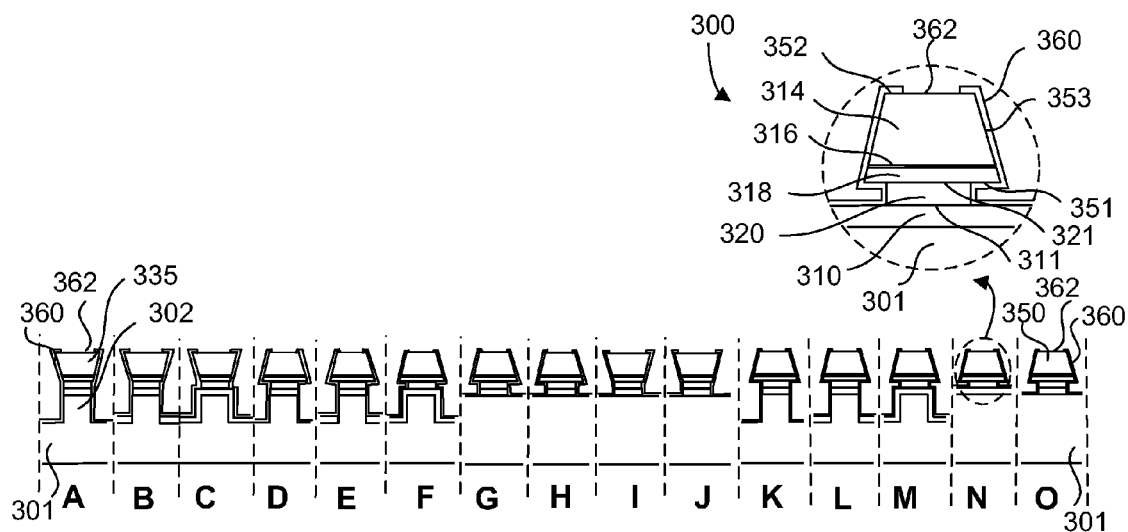
FIG. 27 is a cross-sectional side view illustration of a variety of micro LED structures including contact openings with a smaller width than the top surface of the micro p-n diode in accordance with an embodiment of the invention.
Figure 28:
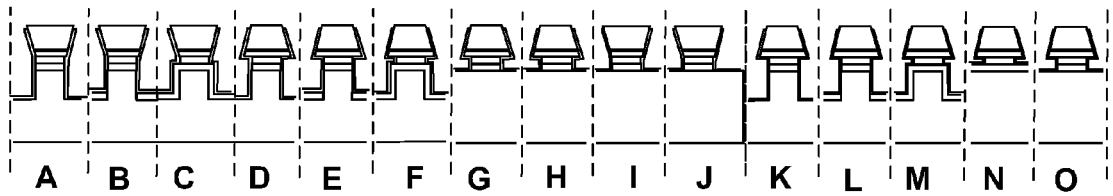
FIG. 28 is a cross-sectional side view illustration of a variety of micro LED structures including contact openings with a larger width than the top surface of the micro p-n diode in accordance with an embodiment of the invention.
Figure 29:
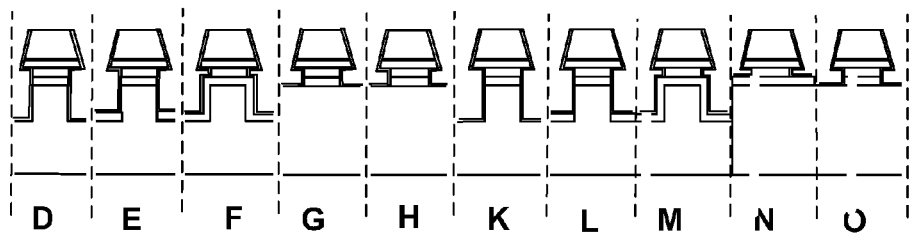
FIG. 29 is a cross-sectional side view illustration of a variety of micro LED structures including contact openings with the same width as the top surface of the micro p-n diode in accordance with an embodiment of the invention.

The micro device may be any of the micro LED device structures illustrated in FIGS. 27-29, and those described in related U.S. patent application Ser. No. 13/372,222. For example, referencing FIG. 27, a micro LED device 300 may include a micro p-n diode 335, 350 and a metallization layer 320, with the metallization layer between the micro p-n diode 335, 350 and a bonding layer 310 formed on a substrate 301. In an embodiment, the micro p-n diode 335, 350 includes a top n-doped layer 314, one or more quantum well layers 316, and a lower p-doped layer 318. The micro p-n diodes can be fabricated with straight sidewalls or tapered sidewalls. In certain embodiments, the micro p-n diodes 350 possess outwardly tapered sidewalls 353 (from top to bottom). In certain embodiments, the micro p-n diodes 335 possess inwardly tapered sidewalls 353 (from top to bottom). The metallization layer 320 may include one or more layers. For example, the metallization layer 320 may include an electrode layer and a barrier layer between the electrode layer and the bonding layer. The micro p-n diode and metallization layer may each have a top surface, a bottom surface and sidewalls. In an embodiment, the bottom surface 351 of the micro p-n diode 350 is wider than the top surface 352 of the micro p-n diode, and the sidewalls 353 are tapered outwardly from top to bottom. The top surface of the micro p-n diode 335 may be wider than the bottom surface of the p-n diode, or approximately the same width. In an embodiment, the bottom surface 351 of the micro p-n diode 350 is wider than the top surface 321 of the metallization layer 320. The bottom surface of the micro p-n diode may also be wider than the top surface of the metallization layer, or approximately the same width as the top surface of the metallization layer.

A conformal dielectric barrier layer 360 may optionally be formed over the micro p-n diode 335, 350 and other exposed surfaces. The conformal dielectric barrier layer 360 may be thinner than the micro p-n diode 335, 350 metallization layer 320 and optionally the bonding layer 310 so that the conformal dielectric barrier layer 360 forms an outline of the topography it is formed on. In an embodiment, the micro p-n diode 335, 350 is several microns thick, such as 3 µm, the metallization layer 320 is 0.1 µm-2 µm thick, and the bonding layer 310 is 0.1 µm-2 µm thick. In an embodiment, the conformal dielectric barrier layer 360 is approximately 50-600 angstroms thick aluminum oxide ($Al_2O_3$). Conformal dielectric barrier layer 360 may be deposited by a variety of suitable techniques such as, but not limited to, atomic layer deposition (ALD). The conformal dielectric barrier layer 360 may protect against charge arcing between adjacent micro p-n diodes during the pick up process, and thereby protect against adjacent micro p-n diodes from sticking together during the pick up process. The conformal dielectric barrier layer 360 may also protect the sidewalls 353, quantum well layer 316 and bottom surface 351, of the micro p-n diodes from contamination which could affect the integrity of the micro p-n diodes. For example, the conformal dielectric barrier layer 360 can function as a physical barrier to wicking of the bonding layer material 310 up the sidewalls and quantum layer 316 of the micro p-n diodes 350. The conformal dielectric barrier layer 360 may also insulate the micro p-n diodes 350 once placed on a receiving substrate. In an embodiment, the conformal dielectric barrier layer 360 span sidewalls 353 of the micro p-n diode, and may cover a quantum well layer 316 in the micro p-n diode. The conformal dielectric barrier layer may also partially span the bottom surface 351 of the micro p-n diode, as well as span sidewalls of the metallization layer 320. In some embodiments, the conformal dielectric barrier layer also spans sidewalls of a patterned bonding layer 310. A contact opening 362 may be formed in the conformal dielectric barrier layer 360 exposing the top surface 352 of the micro p-n diode.

Referring to FIG. 27, the contact opening 362 may have a smaller width than the top surface 352 of the micro p-n diode and the conformal dielectric barrier layer 360 forms a lip around the edges of the top surface 352 of the micro p-n diode. Referring to FIG. 28, the contact opening 362 may have a slightly larger width than the top surface of the micro p-n diode. In such an embodiment, the contact opening 362 exposes the top surface 352 of the micro p-n diode and an upper portion of the sidewalls 353 of the micro p-n diode, while the conformal dielectric barrier layer 360 covers and insulates the quantum well layer(s) 316. Referring to FIG. 29, the conformal dielectric layer 360 may have approximately the same width as the top surface of the micro p-n diode. The conformal dielectric layer 360 may also span along a bottom surface 351 of the micro p-n diodes illustrated in FIGS. 27-29.

In an embodiment, conformal dielectric barrier layer 360 is formed of the same material as dielectric layer 113, 213 of the compliant transfer head. Depending upon the particular micro LED device structure, the conformal dielectric barrier layer 360 may also span sidewalls of the bonding layer 310, as well as the carrier substrate and posts, if present. Bonding layer 310 may be formed from a material which can maintain the micro LED device 300 on the carrier substrate 301 during certain processing and handling operations, and upon undergoing a phase change provide a medium on which the micro LED device 300 can be retained yet also be readily releasable from during a pick up operation. For example, the bonding layer may be remeltable or reflowable such that the bonding layer undergoes a phase change from solid to liquid state prior to or during the pick up operation. In the liquid state the bonding layer may retain the micro LED device in place on the carrier substrate while also providing a medium from which the micro LED device 300 is readily releasable. In an embodiment, the bonding layer 310 has a liquidus temperature or melting temperature below approximately 350° C., or more specifically below approximately 200° C. At such temperatures the bonding layer may undergo a phase change without substantially affecting the other components of the micro LED device. For example, the bonding layer may be formed of a metal or metal alloy, or a thermoplastic polymer which is removable. For example, the bonding layer may include indium, tin or a thermoplastic polymer such as polyethylene or polypropylene. In an embodiment, the bonding layer may be conductive. For example, where the bonding layer undergoes a phase change from solid to liquid in response to a change in temperature a portion of the bonding layer may remain on the micro LED device during the pick up operation. In such an embodiment, it may be beneficial that the bonding layer is formed of a conductive material so that it does not adversely affect the micro LED device when it is subsequently transferred to a receiving substrate. In this case, the portion of conductive bonding layer remaining on the micro LED device during the transfer may aid in bonding the micro LED device to a conductive pad on a receiving substrate. In a specific embodiment, the bonding layer may be formed of indium, which has a melting temperature of 156.7° C. The bonding layer may be laterally continuous across the substrate 301, or may also be formed in laterally separate locations. For example, a laterally separate location of the bonding layer may have a width which is less than or approximately the same width as the bottom surface of the micro p-n diode or metallization layer. In some embodiments, the micro p-n diodes may optionally be formed on posts 302 on the substrate.

Solders may be suitable materials for bonding layer 310 since many are generally ductile materials in their solid state and exhibit favorable wetting with semiconductor and metal surfaces. A typical alloy melts not a single temperature, but over a temperature range. Thus, solder alloys are often characterized by a liquidus temperature corresponding to the lowest temperature at which the alloy remains liquid, and a solidus temperature corresponding to the highest temperature at which the alloy remains solid. An exemplary list of low melting solder materials which may be utilized with embodiments of the invention are provided in Table 1.

TABLE 1

| Chemical composition (weight %) | Liquidus Temperature (° C.) | Solidus Temperature (° C.) |
|---|---|---|
| 100 In | 156.7 | 156.7 |
| 66.3In33.7Bi | 72 | 72 |
| 51In32.5Bi16.5Sn | 60 | 60 |
| 57Bi26In17Sn | 79 | 79 |
| 54.02Bi29.68In16.3Sn | 81 | 81 |
| 67Bi33In | 109 | 109 |
| 90In10Sn | 151 | 143 |
| 48In52Sn | 118 | 118 |
| 50In50Sn | 125 | 118 |
| 52Sn48In | 131 | 118 |
| 58Sn42In | 145 | 118 |
| 97In3Ag | 143 | 143 |

TABLE 1-continued

| Chemical composition (weight %) | Liquidus Temperature (° C.) | Solidus Temperature (° C.) |
|---|---|---|
| 94.5In5.5Ag | 200 | — |
| 99.5In0.5Au | 200 | — |
| 95In5Bi | 150 | 125 |
| 99.3In0.7Ga | 150 | 150 |
| 99.4In0.6Ga | 152 | 152 |
| 99.6In0.4Ga | 153 | 153 |
| 99.5In0.5Ga | 154 | 154 |
| 58Bi42Sn | 138 | 138 |
| 60Sn40Bi | 170 | 138 |
| 100Sn | 232 | 232 |
| 95Sn5Sb | 240 | 235 |
| 100Ga | 30 | 30 |
| 99In1Cu | 200 | — |
| 98In2Cu | 182 | — |
| 96In4Cu | 253 | — |
| 74In26Cd | 123 | 123 |
| 70In30Pb | 175 | 165 |
| 60In40Pb | 181 | 173 |
| 50In50Pb | 210 | 184 |
| 40In60Pb | 231 | 197 |
| 55.5Bi44.5Pb | 124 | 124 |
| 58Bi42Pb | 126 | 124 |
| 45.5Bi54.5Pb | 160 | 122 |
| 60Bi40Cd | 144 | 144 |
| 67.8Sn32.2Cd | 177 | 177 |
| 45Sn55Pb | 227 | 183 |
| 63Sn37Pb | 183 | 183 |
| 62Sn38Pb | 183 | 183 |
| 65Sn35Pb | 184 | 183 |
| 70Sn30Pb | 186 | 183 |
| 60Sn40Pb | 191 | 183 |
| 75Sn25Pb | 192 | 183 |
| 80Sn20Pb | 199 | 183 |
| 85Sn15Pb | 205 | 183 |
| 90Sn10Pb | 213 | 183 |
| 91Sn9Zn | 199 | 199 |
| 90Sn10Au | 217 | 217 |
| 99Sn1Cu | 227 | 227 |
| 99.3Sn0.7Cu | 227 | 227 |

An exemplary list thermoplastic polymers which may be utilized with embodiments of the invention are provided in Table 2.

TABLE 2

| Polymer | Melting Temperature (° C.) |
|---|---|
| Acrylic (PMMA) | 130-140 |
| Polyoxymethylene (POM or Acetal) | 166 |
| Polybutylene terephthalate (PBT) | 160 |
| Polycaprolactone (PCL) | 62 |
| Polyethylene terephthalate (PET) | 260 |
| Polycarbonate (PC) | 267 |
| Polyester | 260 |
| Polyethylene (PE) | 105-130 |
| Polyetheretherketone (PEEK) | 343 |
| Polylactic acid (PLA) | 50-80 |
| Polypropylene (PP) | 160 |
| Polystyrene (PS) | 240 |
| Polyvinylidene chloride (PVDC) | 185 |

Figure 18:
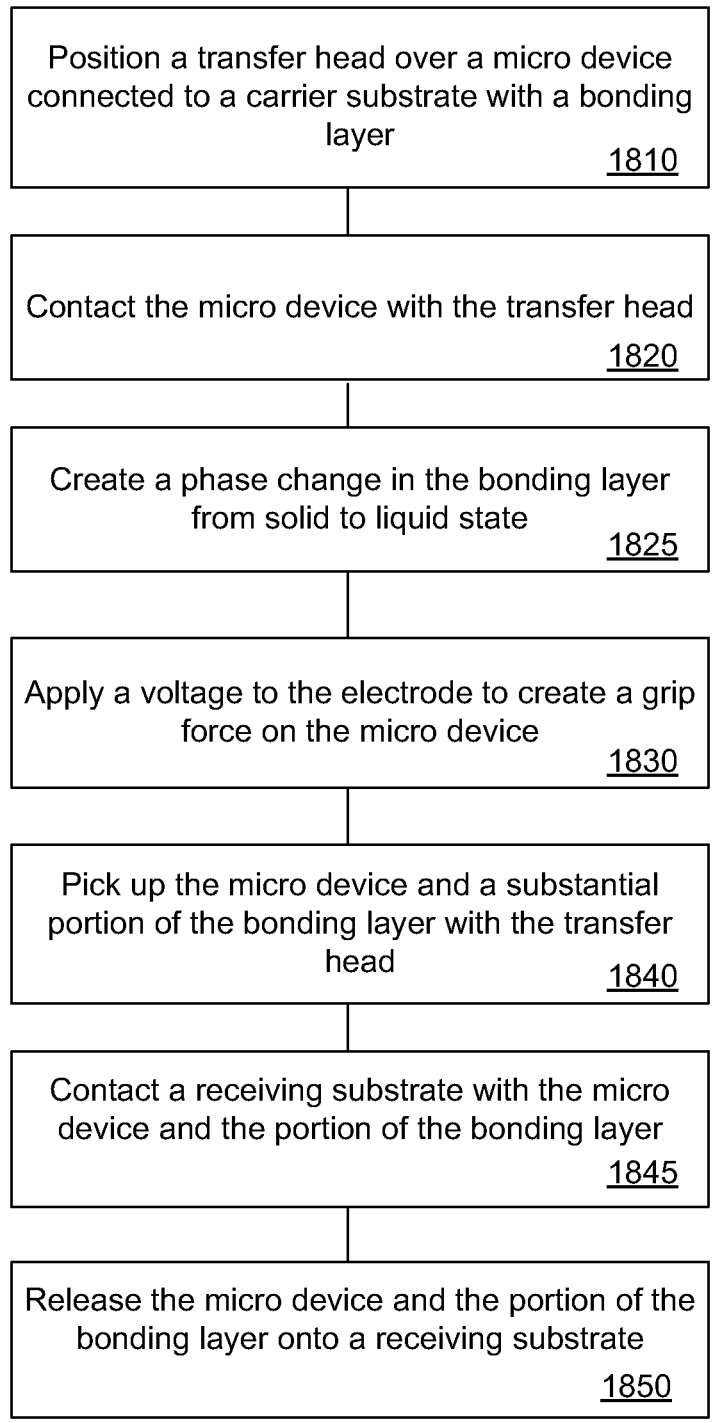
FIG. 18 is a flow chart illustrating a method of picking up and transferring an array of micro devices from a carrier substrate to at least one receiving substrate in accordance with an embodiment of the invention.

FIG. 18 is a flow chart illustrating a method of picking up and transferring a micro device from a carrier substrate to a receiving substrate in accordance with an embodiment of the invention. At operation 1810 a compliant transfer head is positioned over a micro device connected to a carrier substrate with a bonding layer. The compliant transfer head may be any transfer head described herein. The micro device may be any of the micro LED device structures illustrated in FIGS. 27-29 and those described in related U.S. Provisional Application No. 61/561,706 and U.S. Provisional Application No. 61/594,919. The micro device is then contacted with the transfer head at operation 1820. In an embodiment, the micro device is contacted with the dielectric layer 113, 213 of the transfer head. In an alternative embodiment, the transfer head is positioned over the micro device with a suitable air gap separating them which does not significantly affect the grip pressure, for example, 1 nm (0.001 µm) or 10 nm (0.01 µm). At operation 1825 an operation is performed to create a phase change in the bonding layer 310 from solid to liquid state. For example, the operation may include heating an In bonding layer at or above the melting temperature of 156.7° C. In another embodiment, operation 1825 can be performed prior to operation 1820. At operation 1830 the micro device is picked up with the compliant transfer head. For example, a voltage can be applied to an electrode to create a grip pressure on the micro device. A substantial portion of the bonding layer 310 may also be picked up with the transfer head at operation 1840. For example, approximately half of the bonding layer 310 may be picked up with the micro device. In an alternative embodiment, none of the bonding layer 310 is picked up with the transfer head. The micro device, and optionally a portion of the bonding layer 310, is placed in contact with a receiving substrate. The micro device is then released onto the receiving substrate at operation 1850. In accordance with an embodiment of the invention, a variety of operations can be performed to control the phase of the portion of the bonding layer when picking up, transferring, contacting the receiving substrate, and releasing the micro device and portion of the bonding layer 310 on the receiving substrate. For example, the portion of the bonding layer which is picked up with the micro device can be maintained in the liquid state during contacting the receiving substrate and during the release operation 1850. In another embodiment, the portion of the bonding layer can be allowed to cool to a solid phase after being picked up. For example, the portion of the bonding layer can be in a solid phase during contacting the receiving substrate, and again melted to the liquid state prior to or during the release operation 1850. A variety of temperature and material phase cycles can be performed in accordance with embodiments of the invention.

Figure 19:
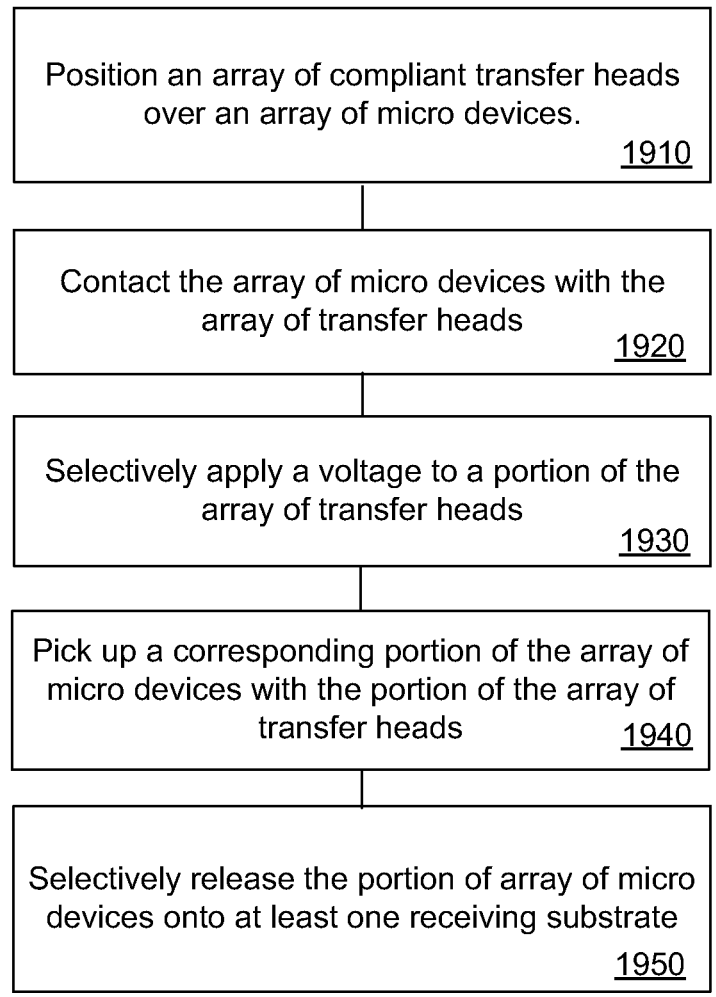
FIG. 19 is a flow chart illustrating a method of picking up and transferring an array of micro devices from a carrier substrate to at least one receiving substrate in accordance with an embodiment of the invention.
Figure 22A:
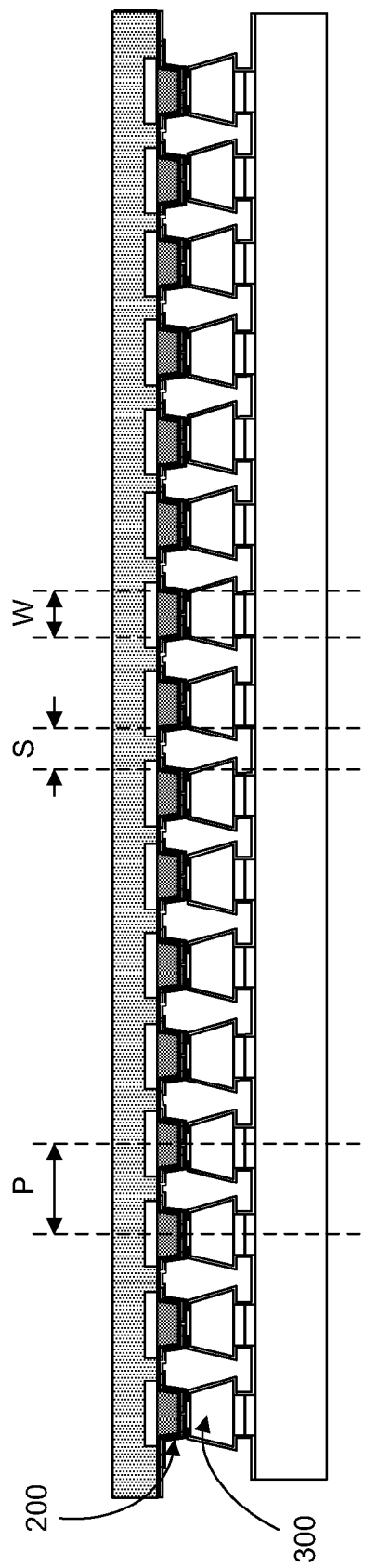
FIGS. 22A-B are cross-sectional side view illustrations of an array of micro device transfer heads in contact with an array of micro LED devices in accordance with an embodiment of the invention.

FIG. 19 is a flow chart illustrating a method of picking up and transferring an array of micro devices from a carrier substrate to at least one receiving substrate in accordance with an embodiment of the invention. At operation 1910 an array of compliant transfer heads is positioned over an array of micro devices. The compliant transfer heads may be any transfer head described herein. At operation 1920 the array of micro devices are contacted with the array of transfer heads. In an alternative embodiment, the array of transfer heads is positioned over the array of micro devices with a suitable air gap separating them which does not significantly affect the grip pressure, for example, 1 nm (0.001 µm) or 10 nm (0.01 µm). FIG. 22A is a side view illustration of an array of micro device transfer heads 200 in contact with an array of micro LED devices 300 in accordance with an embodiment of the invention. As illustrated in FIG. 22A, the pitch (P) of the array of transfer heads 200 matches the pitch of the micro LED devices 300, with the pitch (P) of the array of transfer heads being the sum of the spacing (S) between transfer heads and width (W) of a transfer head.

In one embodiment, the array of micro LED devices 300 have a pitch of 10 µm, with each micro LED device having a spacing of 2 µm and a maximum width of 8 µm. In an exemplary embodiment, assuming a micro p-n diode 350 with straight sidewalls the top surface of the each micro LED device 300 has a width of approximately 8 µm. In such an exemplary embodiment, the width of the top surface 226 of a corresponding transfer head 200 is approximately 8 µm or smaller so as to avoid making inadvertent contact with an adjacent micro LED device. In another embodiment, the array of micro LED devices 300 may have a pitch of 5 µm, with each micro LED device having a spacing of 2 µm and a maximum width of 3 µm. In an exemplary embodiment, the top surface of the each micro LED device 300 has a width of approximately 3 µm. In such an exemplary embodiment, the width of the top surface 226 of a corresponding transfer head 200 is approximately 3 µm or smaller so as to avoid making inadvertent contact with an adjacent micro LED device 300. However, embodiments of the invention are not limited to these specific dimensions, and may be any suitable dimension.

Figure 22B:
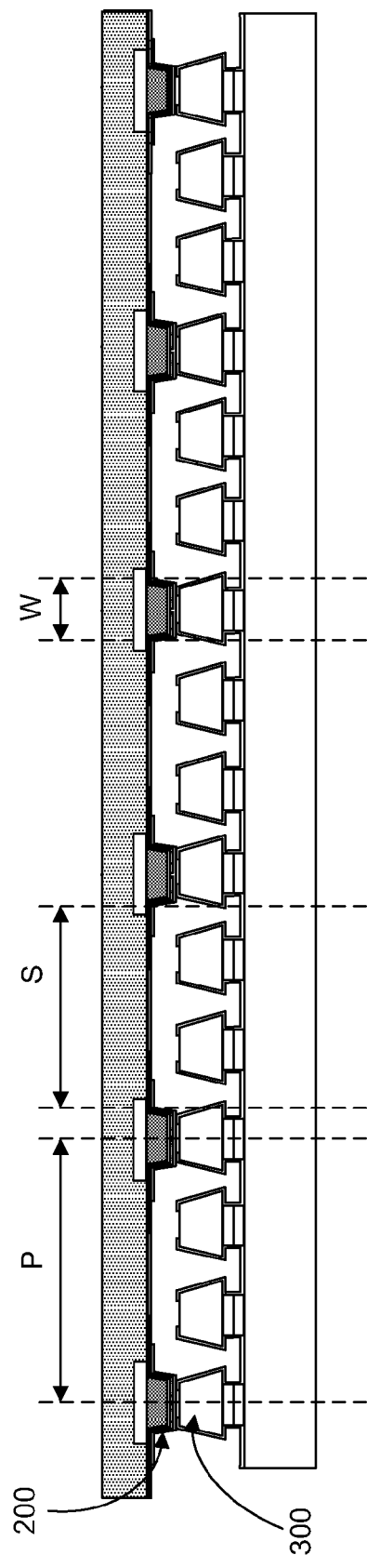

FIG. 22B is a side view illustration of an array of micro device transfer heads in contact with an array of micro LED devices 300 in accordance with an embodiment of the invention. In the embodiment illustrated in FIG. 22B, the pitch (P) of the transfer heads is an integer multiple of the pitch of the array of micro devices. In the particular embodiment illustrated, the pitch (P) of the transfer heads is 3 times the pitch of the array of micro LED devices. In such an embodiment, having a larger transfer head pitch may protect against arcing between transfer heads.

Referring again to FIG. 19, at operation 1930 a voltage is selectively applied to a portion of the array of transfer heads 200. Thus, each transfer head 200 may be independently operated. At operation 1940 a corresponding portion of the array of micro devices is picked up with the portion of the array of transfer heads to which the voltage was selectively applied. In one embodiment, selectively applying a voltage to a portion of the array of transfer heads means applying a voltage to every transfer head in the array of transfer heads. FIG. 23 is a side view illustration of every transfer head in an array of micro device transfer heads picking up an array of micro LED devices 300 in accordance with an embodiment of the invention. In another embodiment, selectively applying a voltage to a portion of the array of transfer heads means applying a voltage to less than every transfer head (e.g. a subset of transfer heads) in the array of transfer heads. FIG. 24 is a side view illustration of a subset of the array of micro device transfer heads picking up a portion of an array of micro LED devices 300 in accordance with an embodiment of the invention. In a particular embodiment illustrated in FIGS. 23-24, the pick up operation includes picking up the micro p-n diode 350, the metallization layer 320 and a portion of the conformal dielectric barrier layer 360 for the micro LED device 300. In a particular embodiment illustrated in FIGS. 23-24, the pick up operation includes picking up a substantial portion of the bonding layer 310. Accordingly, any of the embodiments described with regard to FIGS. 19 and 22A-24 may also be accompanied by controlling the temperature of the portion of the bonding layer 310 as described with regard to FIG. 18. For example, embodiments described with regard to FIGS. 19 and 22A-24 may include performing an operation to create a phase change from solid to liquid state in a plurality of locations of the bonding layer connecting the array of micro devices to the carrier substrate 301 prior to picking up the array of micro devices. In an embodiment, the plurality of locations of the bonding layer can be regions of the same bonding layer. In an embodiment, the plurality of locations of the bonding layer can be laterally separate locations of the bonding layer.

At operation 1950 the portion of the array of micro devices is then released onto at least one receiving substrate. Thus, the array of micro LEDs can all be released onto a single receiving substrate, or selectively released onto multiple substrates. For example, the receiving substrate may be, but is not limited to, a display substrate, a lighting substrate, a substrate with functional devices such as transistors or ICs, or a substrate with metal redistribution lines.

FIG. 25 is a side view illustration of an array of micro device transfer heads holding a corresponding array of micro LED devices 300 over a receiving substrate 401 including a plurality of driver contacts 410. The array of micro LED devices 300 may then be placed into contact with the receiving substrate and then selectively released. FIG. 26 is a side view illustration of the entire array of micro LED devices 300 released onto the receiving substrate 401 over a driver contact 410 in accordance with an embodiment of the invention. In another embodiment, a subset of the array of micro LED devices 300 is selectively released.

In the particular embodiments illustrated in FIGS. 22A-26, the micro devices 300 are those illustrated in FIG. 27, example 27O. However, the micro devices illustrated in FIGS. 22A-26 may be from any of the micro LED device structures illustrated in FIGS. 27-29, and those described in related U.S. patent application Ser. No. 13/372,222.

Figure 20:
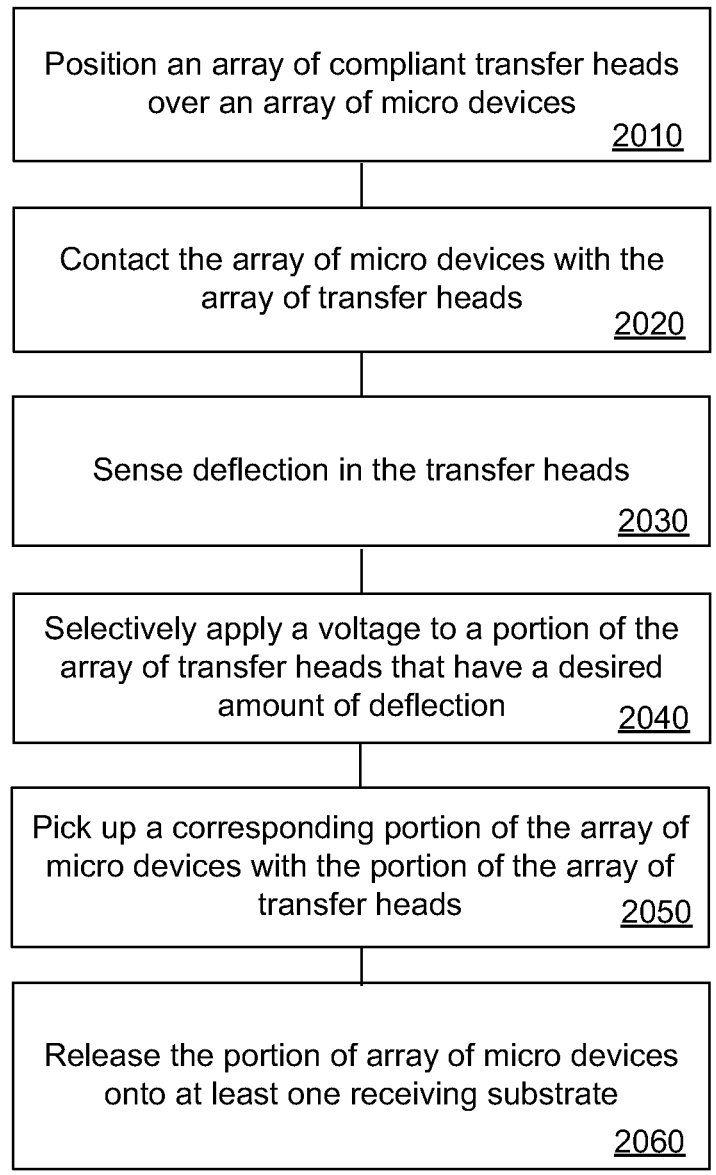
FIG. 20 is a flow chart illustrating a method of picking up and transferring a selected portion of an array of micro devices from a carrier substrate to at least one receiving substrate in accordance with an embodiment of the invention.

FIG. 20 is a flow chart illustrating a method for picking up and transferring an array of micro devices from a carrier substrate to at least one receiving substrate in accordance with an embodiment of the invention. At operation 2010 an array of compliant transfer heads is positioned over an array of micro devices. The compliant transfer heads may be any transfer head described herein. At operation 2020 the array of micro devices are contacted with the array of transfer heads.

At operation 2030 the sensor element is used to measure the degree of deflection of the spring portion of each transfer head. The sensor may measure that the deflection of the spring portion is within an expected range, or alternatively that the deflection exceeds or falls below the expected amount. FIG. 30 illustrates a cross-sectional view of an array of transfer heads 200A-200D in contact over an array of micro devices 300A, 300B, 300D. In an embodiment, transfer head 200A is in contact with the surface of a micro device 300A, causing the spring portion to deflect an amount D into space 212. In another embodiment, transfer head 200B is in contact with contamination particle 400 on the surface of micro devices 300B, causing the spring portion to deflect an amount D+X into space 212. In another embodiment, there is no micro device in the array position corresponding to transfer head 200C, so that transfer head 200C has not deflected any amount into space 212. In yet another embodiment, the surface of micro device 300D is irregular or damaged, such that deflection of transfer head 200D is outside the expected range.

At operation 2040, a voltage is selectively applied to those transfer heads that have deflected within the target range identified as indicating good contact for micro device pick up. In an embodiment, the pull in voltage is not applied to transfer heads that have deflected to a degree greater than the target amount of deflection, to transfer head that have deflected less than the target amount of deflection, or to both. In an embodiment, the pull in voltage is applied to all transfer heads in the array. At operation 2050, a portion of micro devices is picked up corresponding to the selectively activated portion of micro device transfer heads. At operation 2060 the portion of the array of micro devices is then released onto at least one receiving substrate.

Figure 21:
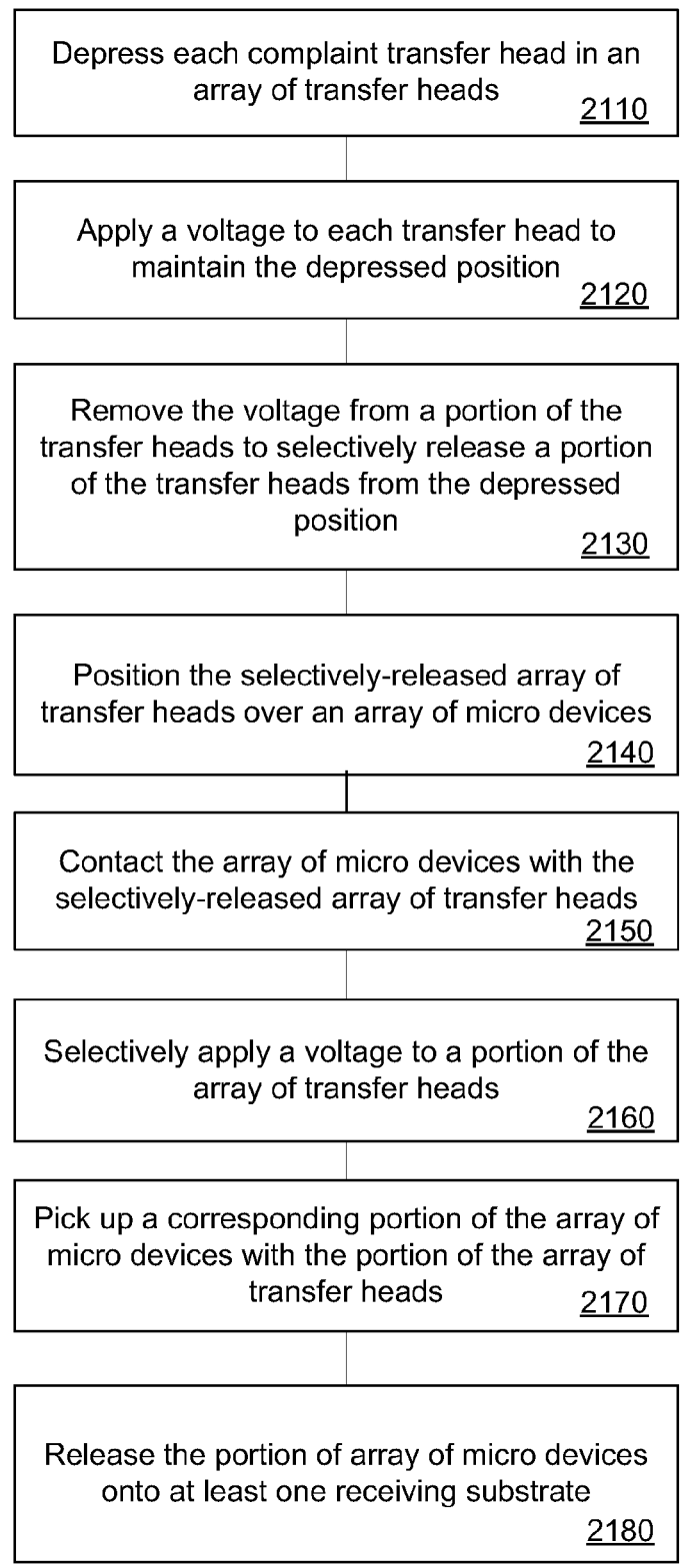
FIG. 21 is a flow chart illustrating a method of picking up and transferring a portion of an array of micro devices from a carrier substrate to at least one receiving substrate based on information from one or more sensors in each of the micro device transfer heads in accordance with an embodiment of the invention.

FIG. 21 is a flow chart illustrating a method of picking up and transferring an array of micro devices from a carrier substrate to at least one receiving substrate in accordance with an embodiment of the invention. Each transfer head in the array has a base substrate, a spring member including a spring anchor coupled to the base substrate and a spring portion comprising an electrode where the spring portion is deflectable into a space between the spring portion and the base substrate, and a dielectric layer covering the top surface of the electrode as described in the above embodiments. At operation 2110 each transfer head in an array of micro device transfer heads is fully depressed. An array of transfer heads may be depressed by, for example, positioning the transfer head array above a flat surface, contacting the array with the flat surface with sufficient pressure to depress each transfer head until the backside electrode 134, 234 of each transfer head contacts the dielectric layer 136, 236 covering the opposing electrode 138, 238 on the base substrate 102, 202.

At operation 2120, each transfer head is locked in the depressed position by applying a voltage across each set of electrodes to lock each transfer head in the depressed position. Where a flat surface has been used to depress the array of transfer heads, the transfer head may then be removed from the flat surface. At operation 2130, the locking voltage is removed from a portion of the transfer heads in order to release them from the depressed position. The selectively released transfer heads are then poised to pick up micro devices. FIG. 31 illustrates a cross-sectional view of an array of micro device transfer heads 200, where a portion of the transfer heads 200A, 200D are locked in the depressed position, and a portion of the transfer heads 200B, 200C have been selectively released from the depressed position.

At operation 2140, the selectively released array of transfer heads is positioned over an array of micro devices. At operation 2150 the array of micro devices are contacted with the array of selectively-released transfer heads. At this operation, only those transfer heads that have been selectively released from the depressed position contact the corresponding micro device in the micro device array. Those transfer heads that remain locked in the depressed position do not contact the surface of a corresponding micro device. In an alternative embodiment, the selectively-released array of transfer heads is positioned over the array of micro devices with a suitable air gap separating them which does not significantly affect the grip pressure between the selectively-released transfer heads and the corresponding portion of micro devices. The arrays may be separated by an air gap distance of, for example, 1 nm (0.001 μm) or 10 nm (0.01 μm).

A voltage may then be applied to the array of transfer heads 200 at operation 2160. In an embodiment, the pull in voltage is applied to all transfer heads in the array. In another embodiment, the pull in voltage is applied only to transfer heads that have been selectively released from the depressed position. At operation 2170 a corresponding portion of the array of micro devices is picked up with the portion of the array of transfer heads that have been selectively released from the depressed position. At operation 2180 the portion of the array of micro devices is then released onto at least one receiving substrate.

In utilizing the various aspects of this invention, it would become apparent to one skilled in the art that combinations or variations of the above embodiments are possible for forming a micro device transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A transfer head array comprising:
   a base substrate; and
   an array of transfer heads, each transfer head comprising:
   a first spring arm extending from a first spring anchor to a spring platform;
   a second spring arm extending from a second spring anchor to the spring platform; and
   a mesa structure on the spring platform, wherein the spring platform is deflectable into a space between the spring platform and the base substrate.

2. The transfer head array of claim 1, wherein the mesa structure generates a profile that protrudes away from the base substrate.

3. The transfer head array of claim 2, wherein the mesa structure is formed integrally with the spring platform.

4. The transfer head array of claim 2, wherein the first spring arm extends from a first corner of the spring platform to the first spring anchor.

5. The transfer head array of claim 4, wherein the second spring arm extends from a second corner of the spring platform to the second spring anchor.

6. The transfer head array of claim 2, wherein each of the first and second spring arms has a length of 8 to 30 μm.

7. The transfer head array of claim 2, wherein each mesa structure includes a corresponding top surface, and the top surfaces are coplanar.

8. The transfer head array of claim 7, further comprising a dielectric layer covering the top surface of each mesa structure.

9. The transfer head array of claim 2, further comprising a first bend along a length of the first spring arm.

10. The transfer head array of claim 9, further comprising a second bend along a length of the second spring arm.

11. The transfer head array of claim 2, further comprising a second mesa structure on the spring platform, wherein the second mesa structure generates a profile that protrudes away from the base substrate.

12. The transfer head array of claim 11, wherein the mesa structure and the second mesa structure are formed integrally with the spring platform.

13. The transfer head array of claim 11, further comprising a dielectric layer covering the mesa structure and the second mesa structure of each transfer head.

14. The transfer head array of claim 11, further comprising a first bend along a length of the first spring arm.

15. The transfer head array of claim 14, further comprising a second bend along a length of the second spring arm.

16. The transfer head array of claim 15, wherein the first spring arm extends from a first corner of the spring platform to the first spring anchor.

17. The transfer head array of claim 16, wherein the second spring arm extends from a second corner of the spring platform to the second spring anchor.

* * * * *